(12) United States Patent
Cai et al.

(10) Patent No.: US 12,167,674 B2
(45) Date of Patent: Dec. 10, 2024

(54) METAL COMPLEX WITH FLUORINE SUBSTITUTION

(71) Applicant: BEIJING SUMMER SPROUT TECHNOLOGY CO., LTD., Beijing (CN)

(72) Inventors: Wei Cai, Beijing (CN); Ming Sang, Beijing (CN); Zhen Wang, Beijing (CN); Tao Wang, Beijing (CN); Chi Yuen Raymond Kwong, Beijing (CN); Chuanjun Xia, Beijing (CN)

(73) Assignee: Beijing Summer Sprout Technology Co., Ltd. (CN)

( * ) Notice: Subject to any disclaimer, the term of this patent is extended or adjusted under 35 U.S.C. 154(b) by 238 days.

(21) Appl. No.: 16/569,937

(22) Filed: Sep. 13, 2019

(65) Prior Publication Data

US 2020/0091442 A1    Mar. 19, 2020

(30) Foreign Application Priority Data

Sep. 15, 2018  (CN) .......................... 201811071665.6

(51) Int. Cl.
*H01L 51/00* (2006.01)
*C07F 15/00* (2006.01)
(Continued)

(52) U.S. Cl.
CPC ....... *H10K 85/342* (2023.02); *C07F 15/0033* (2013.01); *C09K 11/02* (2013.01); *C09K 11/06* (2013.01); *C09K 2211/1007* (2013.01); *C09K 2211/1029* (2013.01); *C09K 2211/1088* (2013.01); *C09K 2211/185* (2013.01);
(Continued)

(58) Field of Classification Search
CPC ............ H01L 51/0085; C07F 15/0033; C09K 2211/185; C09K 2211/1029; C09K 2211/1088; H10K 85/342
See application file for complete search history.

(56) References Cited

U.S. PATENT DOCUMENTS 5,703,436 A    12/1997  Forrest et al.
5,707,745 A    1/1998   Forrest et al.
(Continued)

FOREIGN PATENT DOCUMENTS

CN    104419415 A    3/2015
CN    104650151 A    5/2015
(Continued)

OTHER PUBLICATIONS

Richard J. Lewis, Sr. "Hawley's Condensed Chemical Dictionary, 12th Edition", John Wiley & Sons, Inc., New York p. 583 (1993).*
(Continued)

*Primary Examiner* — Alexander C Kollias
(74) *Attorney, Agent, or Firm* — BARNES & THORNBURG LLP; Jeffrey R. Stone

(57) ABSTRACT

A metal complex with fluorine substitution is disclosed, which employs a series of new ligands containing fluorine-substituted structure can be used as a luminescent material in an emissive layer of an electroluminescent device. By using the metal complex can provide much longer device lifetime, better thermal stability, no blue-shifted illumination, and higher luminous efficiency. An electroluminescent device and compound formulation are also disclosed.

16 Claims, 2 Drawing Sheets

Figure 1:
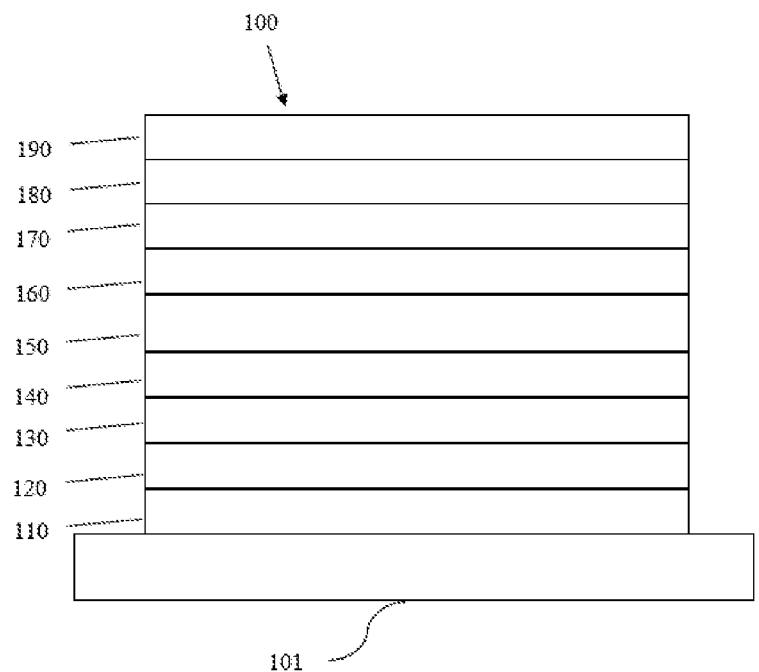

(51) Int. Cl.
    *C09K 11/02*            (2006.01)
    *C09K 11/06*            (2006.01)
    *H10K 85/30*            (2023.01)
    *H10K 50/11*            (2023.01)
    *H10K 101/00*           (2023.01)
    *H10K 101/10*           (2023.01)

(52) U.S. Cl.
    CPC .......... *H10K 50/11* (2023.02); *H10K 2101/10* (2023.02); *H10K 2101/90* (2023.02)

(56) References Cited

U.S. PATENT DOCUMENTS

| | | | |
|---|---|---|---|
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 8,946,697 | B1 | 2/2015 | Ma et al. |
| 2003/0068535 | A1 | 4/2003 | Takiguchi et al. |
| 2003/0230980 | A1 | 12/2003 | Forrest et al. |
| 2004/0121184 | A1 | 6/2004 | Thompson et al. |
| 2004/0172116 | A1 | 9/2004 | Seiffert et al. |
| 2004/0174116 | A1 | 9/2004 | Lu et al. |
| 2010/0244004 | A1 | 9/2010 | Xia et al. |
| 2012/0292601 | A1 | 11/2012 | Kottas et al. |
| 2013/0026452 | A1* | 1/2013 | Kottas ................ H10K 85/6572 546/4 |
| 2013/0181190 | A1 | 7/2013 | Ma et al. |
| 2014/0131687 | A1 | 5/2014 | Lin et al. |
| 2014/0159028 | A1 | 6/2014 | Kottas et al. |
| 2014/0175408 | A1 | 6/2014 | Lin et al. |
| 2014/0231755 | A1 | 8/2014 | Xia et al. |
| 2014/0252333 | A1 | 9/2014 | Watanabe et al. |
| 2015/0053939 | A1* | 2/2015 | Adamovich ......... C07D 487/04 257/40 |
| 2015/0069334 | A1 | 3/2015 | Xia et al. |
| 2015/0115250 | A1 | 4/2015 | Ma et al. |
| 2015/0129840 | A1 | 5/2015 | Tsai et al. |
| 2015/0137096 | A1 | 5/2015 | Xia et al. |
| 2015/0155501 | A1 | 6/2015 | Xia et al. |
| 2015/0171349 | A1* | 6/2015 | Ma ...................... C07F 15/0033 546/4 |
| 2015/0236276 | A1 | 8/2015 | Boudreault et al. |
| 2015/0280146 | A1 | 10/2015 | Xia et al. |
| 2015/0315222 | A1 | 11/2015 | Boudreault et al. |
| 2015/0349273 | A1 | 12/2015 | Hung et al. |
| 2016/0049599 | A1 | 2/2016 | Ma et al. |
| 2016/0079546 | A1 | 3/2016 | Park et al. |
| 2016/0093815 | A1 | 3/2016 | Ma et al. |
| 2016/0093816 | A1 | 3/2016 | Ma et al. |
| 2016/0133859 | A1* | 5/2016 | Boudreault ......... C07F 15/0033 257/40 |
| 2016/0133860 | A1 | 5/2016 | Boudreault et al. |
| 2016/0141522 | A1 | 5/2016 | Ma |
| 2016/0155963 | A1 | 6/2016 | Hwang et al. |
| 2016/0240799 | A1 | 8/2016 | Tsai et al. |
| 2016/0285014 | A1 | 9/2016 | Kottas et al. |
| 2016/0359122 | A1 | 12/2016 | Boudreault et al. |
| 2017/0084849 | A1 | 3/2017 | Tsai et al. |
| 2017/0170414 | A1 | 6/2017 | Tsai et al. |
| 2017/0263872 | A1 | 9/2017 | Ma et al. |
| 2017/0365799 | A1 | 12/2017 | Ji et al. |
| 2017/0365800 | A1 | 12/2017 | Tsai et al. |
| 2017/0365801 | A1 | 12/2017 | Margulies et al. |
| 2018/0019406 | A1 | 1/2018 | Lee et al. |
| 2018/0026208 | A1 | 1/2018 | Tsai et al. |
| 2018/0097185 | A1 | 4/2018 | Su et al. |
| 2018/0102487 | A1 | 4/2018 | Tsai et al. |
| 2018/0190914 | A1 | 7/2018 | Tsai et al. |
| 2018/0254417 | A1 | 9/2018 | Ma et al. |
| 2018/0287070 | A1 | 10/2018 | Ji et al. |
| 2019/0006590 | A1* | 1/2019 | Park ................... H10K 85/6574 |
| 2019/0140191 | A1 | 5/2019 | Tsai et al. |
| 2019/0245153 | A1 | 8/2019 | Kottas et al. |
| 2020/0091442 | A1 | 3/2020 | Cai et al. |
| 2020/0251666 | A1* | 8/2020 | Cai ..................... H01L 51/0085 |

FOREIGN PATENT DOCUMENTS

| | | |
|---|---|---|
| CN | 105585594 A | 5/2016 |
| CN | 108164564 | 6/2018 |
| CN | 108530490 | 9/2018 |
| CN | 108690085 | 10/2018 |
| CN | 108822154 | 11/2018 |
| CN | 110256499 | 9/2019 |
| EP | 1238981 A2 | 11/2002 |
| EP | 2551274 | 1/2013 |
| EP | 2730583 | 5/2014 |
| EP | 2874192 | 5/2015 |
| JP | 2002332291 | 11/2002 |
| JP | 2008074921 | 4/2008 |
| JP | 2013028604 | 2/2013 |
| JP | 2013147497 | 8/2013 |
| JP | 2014516965 | 7/2014 |
| JP | 2016037499 | 3/2016 |
| JP | 2016219490 | 12/2016 |
| JP | 2020066622 A | 4/2020 |
| KR | 20150056466 A | 5/2015 |
| KR | 20150056467 A | 5/2015 |
| KR | 20150070021 A | 6/2015 |
| KR | 1020180069860 A | 6/2018 |
| WO | 2003084972 A1 | 10/2003 |
| WO | 2009069442 A1 | 6/2009 |
| WO | 2015/158851 | 11/2012 |
| WO | 2012/170461 | 12/2012 |
| WO | 2012/170463 | 12/2012 |
| WO | 2012/170571 | 12/2012 |
| WO | 2015/053463 | 4/2015 |
| WO | 2016208873 A1 | 12/2016 |
| WO | 2019/221484 | 11/2019 |

OTHER PUBLICATIONS

Japanese Office Action and English translation issued in Patent Application No. 2019-166850 and dated Aug. 24, 2020.
Extended European Search Report issued in Patent Application No. 19196328.9 and dated Dec. 19, 2019.
Uoyama et al. "Highly efficient organic light-emitting diodes from delayed fluorescene", Nature, vol. 492, Dec. 13, 2012.
Tang et al. "Organic electroluminescent diodes", Appl. Phys. Lett. 51, 913 (1987); doi: 10.1063/1.98799.
German Office Action for German Patent Application No. 102020101561.5 dated Jan. 29, 2021 and its English translation.
Japanese Office Action for Japanese Patent Application No. 2020-011825 dated Jan. 6, 2021 and its English translation.
Korean Office Action for Korean Patent Application No. 102020008644 submitted Nov. 13, 2021 and its English translation.
Pawar, et al., "Cobalt-Catalyzed C-H Cyanation of (Hetero)arenes and 6-Arylpurines with N-Cyanosuccinimide as a New Cyanating Agent", American Chemical Society, Organic Letters, 2015, 17, 660-663.
Tani, et al., "Antifungal activities of novel non-azole molecules against *S. cerevisiae* and *C. albicans* ", European Journal of Medicinal Chemistry, 47 (2012), 270-277.
Yalcin, et al., "Novel fluorene/fluorenone DNA and RNA binders as efficient non-toxic ds-RNA selective fluorescent probes", Tetrahedron, 74 (2018), 535-543.
Korean Office Action, dispatched Feb. 22, 2022, in Korean Application No. 10-2021-0155573, filed Nov. 12, 2021 and its English translation.
Chinese Search Report for Chinese Application No. 2018110716656 filed Sep. 15, 2018.
English translation of Chinese Search Report for Chinese Application No. 2018110716656.6 filed Sep. 15, 2018.
First Chinese Office Action for Chinese Application No. 201811071665.6, issued May 19, 2022.
English translation of First Chinese Office Action for Chinese Application No. 201811071665.6, issued May 19, 2022.

(56) References Cited

OTHER PUBLICATIONS

Extended European Search Report, for European Patent Application No. 22165435.3, dated Jan. 13, 2023.
Japanese Office Action for Japanese Patent Application No. 2021-049823, dated Jan. 27, 2022.
English translation of Japanese Office Action for Japanese Patent Application No. 2021-049823, dated Jan. 27, 2022.
Korean Office Action for Korean Application No. 10-2019-0113514, filed Sep. 16, 2019, dispatched Mar. 22, 2021.
English translation for Korean Office Action for Korean Application No. 10-2019-0113514, filed Sep. 16, 2019, dispatched Mar. 22, 2021.
Korean Final Office Action for Korean Application No. 10-2019-0113514, filed Sep. 16, 2019, dispatched Jun. 24, 2021.
English translation of Korean Final Office Action for Korean Application No. 10-2019-0113514, filed Sep. 16, 2019, dispatched Jun. 24, 2021.
Korean Final Office Action for Korean Application No. 10-2021-0155573, filed Nov. 12, 2021, dispatched Aug. 30, 2022.
English translation of Korean Final Office Action for Korean Application No. 10-2021-0155573, filed Nov. 12, 2021, dispatched Aug. 30, 2022.

* cited by examiner

METAL COMPLEX WITH FLUORINE SUBSTITUTION

This application claims the benefit of Chinese Application No. 201811071665.6, filed Sep. 15, 2018, the entire content of which is incorporated herein by reference.

1 FIELD OF THE INVENTION

The present invention relates to compounds for organic electronic devices, such as organic light emitting devices. More specifically, the present invention relates to a metal complex comprising fluorine substitution, and an electroluminescent device and compound formulation comprising the metal complex.

2 BACKGROUND ART

An organic electronic device is preferably selected from the group consisting of organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This invention laid the foundation for the development of modern organic light-emitting diodes (OLEDs), State-of-the-art OLEDs may comprise multiple layers such as charge injection and transporting layers, charge and excitors blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent ° LEDs at high brightness remains a problem. In addition, it is desirable to have more saturated emitting color, higher efficiency, and longer device lifetime.

Fluorine substitution is often introduced into phosphorescent metal complex, such as an iridium complex, to produce a blue-shifted emission color. Unfortunately, in the most cases, the introduction of fluorine greatly shortens the lifetime of the device, and slightly reduces the efficiency of the device. US20150115250A1 disclosed a series of 4-fluorophenyl substituted iridium complex. It turns out that this substitution mode reduces device lifetime in the most cases. Compared to non-fluorine substitution, only one example shows improved lifetime. Therefore, fluorine substitution can rarely improve the lifetime of the device. The fluorine substitution of the disclosed complexes is all on the pyridine side of the phenylpyridine ligand, that is to say, the substitution can be considered to stabilize the LUMO of the metal complex, proving that introducing fluorine substitution at a specific position is reasonable.

Metal complexes of alkyl substituted pyridyl dibenzofuran ligands have been disclosed in some patent applications, such as US20030068535A1, US20100244004A1, US20130026452A1, WO2012158851 A1. Alkyl is used to adjust luminescent color, sublimation temperature, device efficiency and lifetime. However, the thermal stability of branched alkyl groups is problematic for long term evaporation.

According to existing research, by introducing a fluorine substitution on the side of the dibenzo-5-membered heterocyclic compound, such as introducing a fluorine substitution on the side of dibenzofuran, as the persons skilled in the art can expect that the HOMO level of the complex will be deeper, the light emission will be blue-shifted. But our research is unexpected. The present invention discloses a series of new metal complexes with fluorine substitution that show a lot of features unexpectedly, for example, much longer device lifetime, better thermal stability, and no blue-shifted emission.

3 SUMMARY OF THE INVENTION

The present invention aims to provide a series of new metal complexes with fluorine substitution to solve at least part of above problems. The metal complexes can be used as emitters in the emissive layer of an electroluminescent device. The use of these metal complexes enables to obtain much longer device lifetime, better thermal stability, no blue-shifted emission, and higher luminous efficiency and etc.

According to an embodiment of the present invention, a metal complex comprising a partial structure represented by Formula 1 is disclosed:

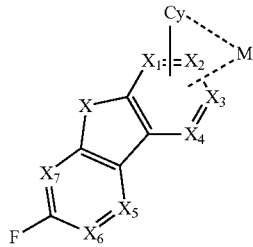

Formula 1

Wherein Cy is a substituted or unsubstituted carbocyclic group or heterocyclic group having 5 to 24 aromatic ring atoms;
Wherein Cy is combined with M through a metal-carbon bond or a metal-nitrogen bond;
Wherein M is selected from the group consisting of copper (Cu), silver (Ag), gold (Au), rhodium (Rh), ruthenium (Ru), palladium (Pd), osmium (Os), iridium (Ir), and platinum (Pt);
Wherein X is selected from O, S or Se;
Wherein $X_1$ to $X_7$ are independently selected from N or CR;
Wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted all group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thioalkyl group, a sulfinyl group, a sulfonyl group, a phosphine group, and combinations thereof;
Two adjacent substitutions are optionally joined to form a ring;
$X_1$, $X_2$, $X_3$, or $X_4$ is connected to M through a metal-carbon bond or a metal-nitrogen bond.

According to another embodiment of the present invention, an electroluminescent device is also disclosed, which comprises:
an anode,
a cathode,
and an organic layer disposed between the anode and the cathode, wherein the organic layer comprises a metal complex, wherein the metal complex comprises a partial structure represented by Formula 1:

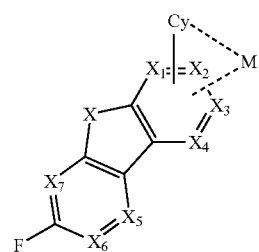

Formula 1

Wherein Cy is a substituted or unsubstituted carbocyclic group or heterocyclic group having 5 to 24 aromatic ring atoms;
Wherein Cy is combined with M through a metal-carbon bond or a metal-nitrogen bond;
Wherein is selected from the group consisting of copper (Cu), silver (Ag), gold (Au), rhodium (Rh), ruthenium (Ru), palladium (Pd), osmium (Os), iridium (Ir), and platinum (Pt);
Wherein X is selected from O, S or Se;
Wherein $X_1$ to $X_7$ are independently selected from N or CR;
Wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thioalkyl group, a sulfinyl group, a sulfonyl group, a phosphino group, and combinations thereof;
Two adjacent substitutions are optionally joined to form a ring;
$X_1$, $X_2$, $X_3$, or $X_4$ is connected to M through a metal-carbon bond or a metal-nitrogen bond.

According to yet another embodiment of the present invention, a formulation comprising the metal complex is also disclosed, wherein the metal complex comprising a partial structure represented by Formula 1.

The metal complex disclosed in the present invention can be used as emitters in the emissive layer of an organic electroluminescent device. By introducing fluorine substitution at a specific position, these metal complexes show a lot of features unexpectedly, for example, much longer device lifetime, better thermal stability, no blue-shifted emission and higher luminous efficiency, etc. The metal complexes are easy to use in the manufacture of an OLED, and can provide an electroluminescent device with high efficiency and long lifetime.

4 BRIEF DESCRIPTION OF THE DRAWINGS

FIG. 1 schematically shows an organic light emitting device that can incorporate the metal complex or formulation disclosed herein.

Figure 2:
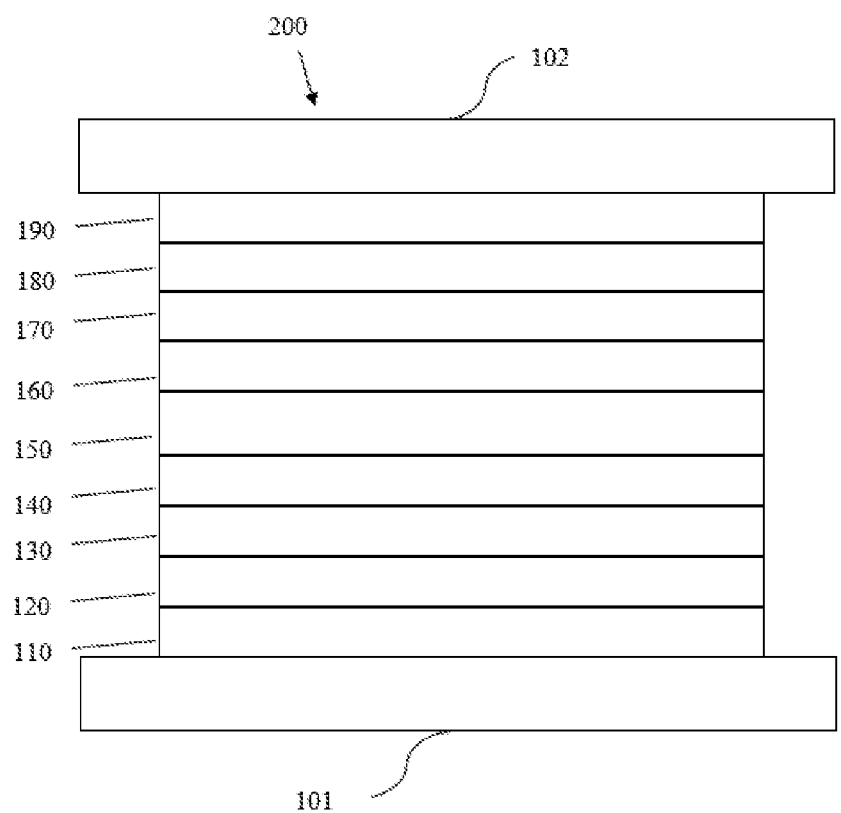

FIG. 2 schematically shows another organic light emitting device that can incorporate the metal complex or formulation disclosed herein.

Figure 3:
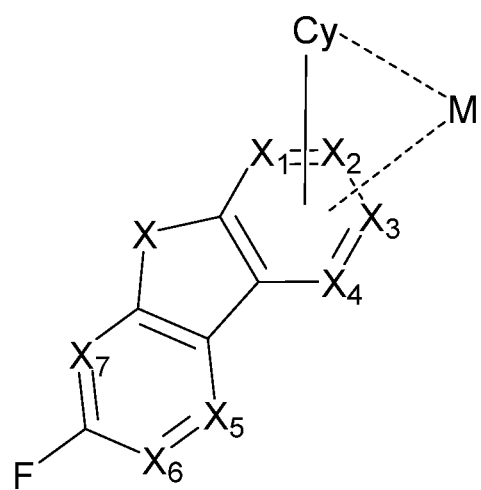

FIG. 3 shows a metal complex comprising a partial structure represented by Formula 1 disclosed herein.

5 DETAILED DESCRIPTION

OLEDs can be fabricated on various types of substrates such as glass, plastic, and metal foil. FIG. 1 schematically shows the organic light emitting device 100 without limitation. The figures are not necessarily drawn to scale. Some of the layer in the figure can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, which are incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of host materials are disclosed in U.S. Pat. No. 6,303,238 to Thompson et at, which is incorporated by reference in its entirety. An example of an n-doped electron transport layer is BPhen doped with Li at a molar ratio of 1:1, as disclosed in U.S. Patent Application Publication No. 9003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The layered structure described above is provided by way of non-limiting example. Functional OLEDs may be achieved by combining the various layers described in different ways, or layers may be omitted entirely, such as an electron blocking layer. It may also include other layers not specifically described. Within each layer, a single material or a mixture of multiple materials can be used to achieve optimum performance. Any functional layer may include several sublayers. For example, the emissive layer may have a two layers of different emitting materials to achieve desired emission spectrum.

In one embodiment, an OLED may be described as having an "organic layer" disposed between a cathode and an anode. This organic layer may comprise a single layer or multiple layers.

An OLED can be encapsulated by a barrier layer, FIG. 2 schematically shows the organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass and organic-inorganic hybrid layers. The barrier layer should be placed directly or indirectly outside of the OLED device. Multilayer thin film encapsulation was described in U.S. Pat. No. 7,968,146, which is herein incorporated by reference in its entirety.

Devices fabricated in accordance with embodiments of the invention can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" When it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_{S-T}$. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcylcohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing two to fifteen carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing two to fifteen carbon atoms. Additionally, the alkynyl group may be optionally substituted.

Aryl or aromatic group—as used herein contemplates noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein contemplates aromatic and non-aromatic cyclic groups. Heteroaromatic also means heteroaryl. Preferred non-aromatic heterocyclic groups are those containing 3 to 7 ring atoms which includes at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein contemplates noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha-naphthylmethyl group, 1-alpha-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodoberizyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline,dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, arylalkyl, aryloxy, amino, cyclic amino, silyl, alkenyl, cycloalkenyl, heteroalkenyl, alkynyl, aryl, heteroaryl, an acyl group, a carbonyl group, a carboxylic acid group, an ether group, an ester group, a nitrile group, an isonitrile group, a thioalkyl group, a sulfinyl group, a sulfonyl group, a phosphine group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions.

In the compounds mentioned in this disclosure, the expression that adjacent substituents are optionally joined to form a ring is intended to be taken to mean that two radicals are linked to each other by a chemical bond. This is illustrated by the following scheme:

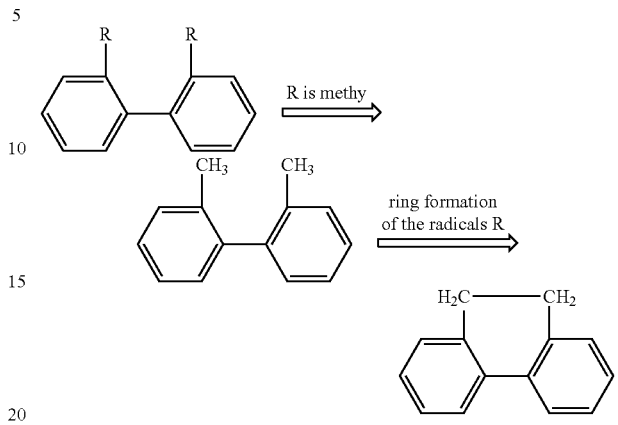

Furthermore, the expression that adjacent substituents are optionally joined to form a ring is also intended to be taken to mean that in the case where one of the two radicals represents hydrogen, the second radical is bonded at a position to which the hydrogen atom was bonded, with formation of a ring. This is illustrated by the following scheme:

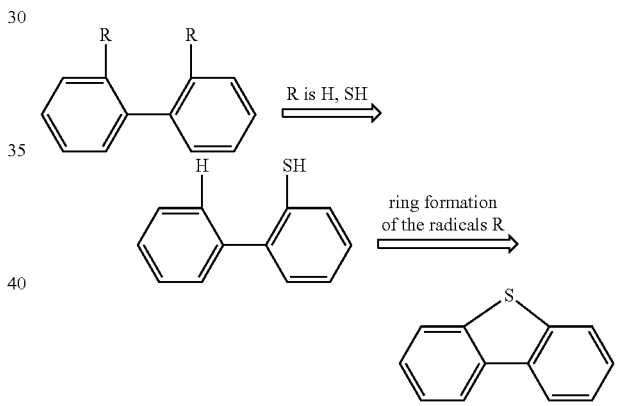

According to an embodiment of the present invention, a metal complex comprising a partial structure of Formula 1 is disclosed:

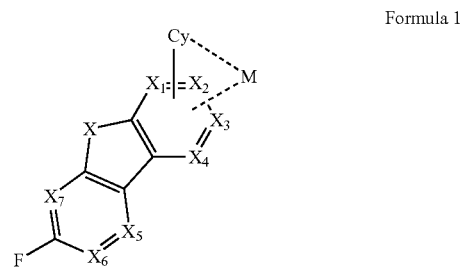

Formula 1

Wherein Cy is a substituted or unsubstituted carbocyclic or heterocyclic group having 5 to 24 aromatic ring atoms;

Wherein Cy is combined with M by a metal-carbon bond or a metal-nitrogen bond;

Wherein M is selected from the group consisting of copper (Cu), silver (Ag), gold (Au), rhodium (Rh), ruthenium (Ru), palladium (Pd), osmium (Os), iridium (h), and platinum (Pt);

Wherein X is selected from O, S or Se;

Wherein $X_1$ to $X_7$ are each independently selected from N or CR;

Wherein R is selected from the group consisting of hydrogen, deuterium, halogen; a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thioalkyl group, a sulfinyl group, a sulfonyl group, a phosphino group, and combinations thereof;

Two adjacent substitutions are optionally joined to form a ring;

$X_1$, $X_2$, $X_3$, or $X_4$ is connected to M by a metal-carbon bond or a metal-nitrogen bond.

In this embodiment, when Cy is a substituted carbocyclic group or heterocyclic, group having 5 to 24 aromatic ring atoms, it means that a mono-substitution, a di-substitution, or up to the maximum available substitutions may be present on the carbocyclic or heterocyclic group having 5 to 2.4 aromatic ring atoms. The above substitutions may each independently be selected from the group consisting of deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thioalkyl group, a sulfinyl group, a sulfonyl group, a phosphino group, and combinations thereof.

In this embodiment, the persons skilled in the art can clearly understand, when Cy is connected to one of $X_1$ to $X_4$, one of $X_1$ to $X_4$ connected to Cy is C. When M is connected to one of $X_1$ to $X_4$ through a mental-carbon bond, one of $X_1$ to $X_4$ connected to M is C.

According to an embodiment of the present invention, wherein the metal is selected from the group consisting of Pt and Ir.

According to an embodiment of the present invention, wherein Cy comprises a partial structure selected from the group consisting of:

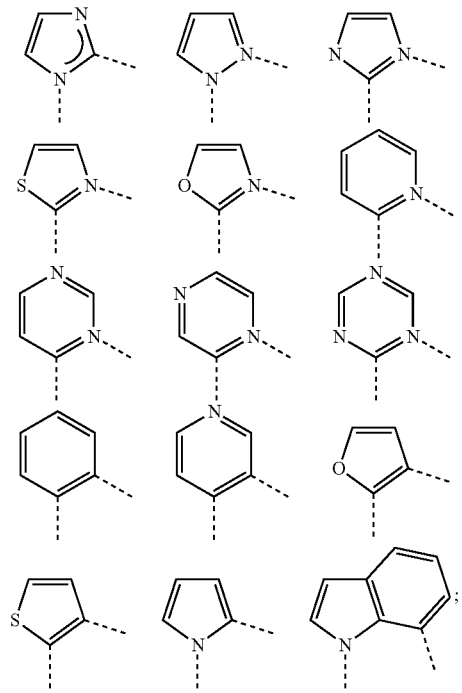

In this embodiment, Cy comprises a partial structure selected from the above group, it means that Cy comprises any one substituted or unsubstituted group selected from the above group. When Cy is the substituted group, it means that there may be a mono-substitution, a di-substitution, or up to the maximum available substitution on the group. The above substitutions may each independently be selected from the group consisting of deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic, acid group, an ester group, a nitrile group, an isonitrile group, a thioalkyl group, a sulfinyl group, a sulfonyl group, a phosphino group, and combinations thereof.

According to another embodiment of the present invention, wherein the metal complex has the general formula of $M(L_a)_m(L_b)_n(L_c)_q$, wherein $L_b$ and $L_c$ are the second and third ligand coordinating to M, $L_b$ and $L_c$ can be the same or different;

$L_a$, $L_b$, and $L_c$, can be optionally joined to form a tetradentate or hexadentate ligand;
Wherein m is 1, 2, or 3, n is 0, 1, or 2, q is 0, 1, or 2; m+n+q is the oxidation state of M.
Wherein $L_a$ is independently selected from the group consisting of:
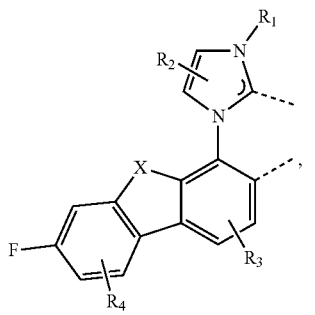
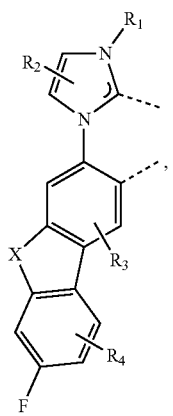
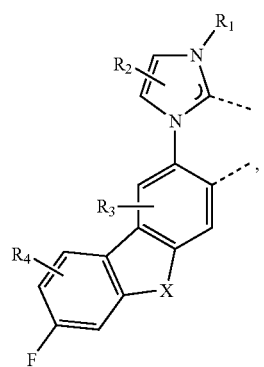
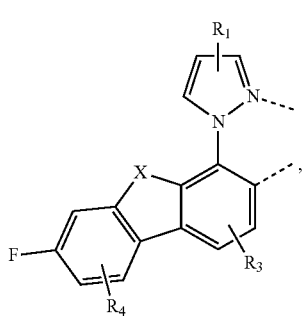
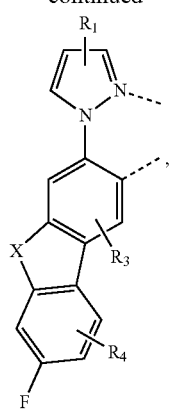
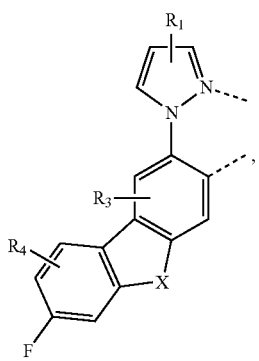
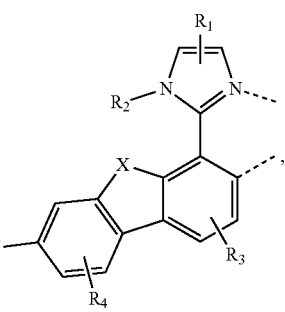
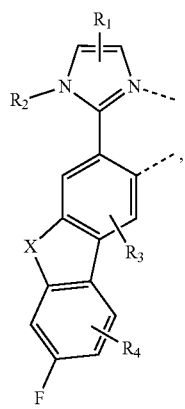

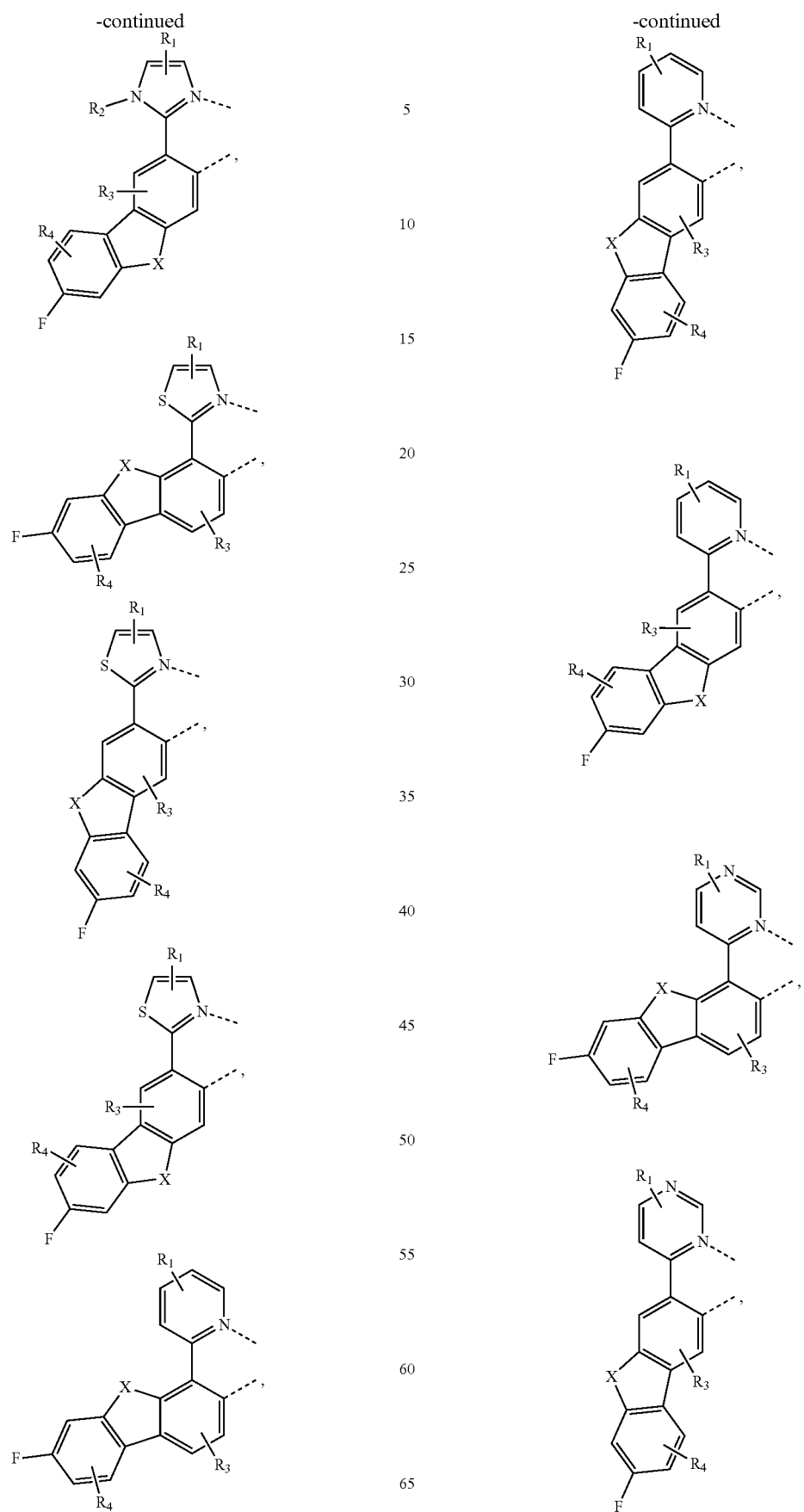

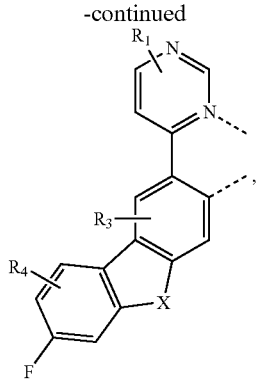
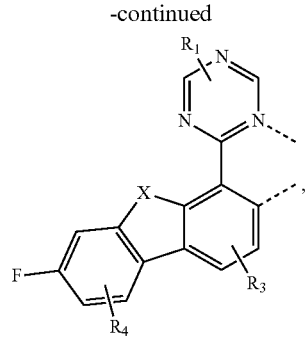
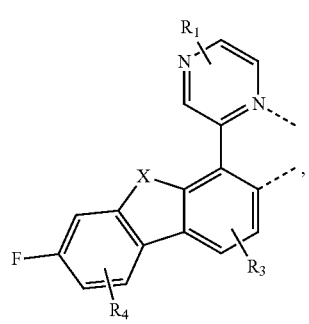
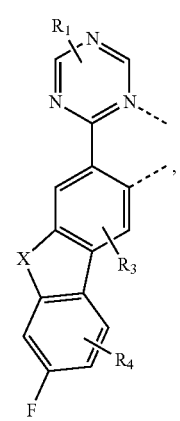
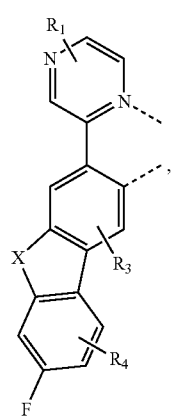
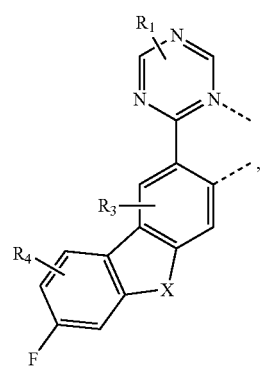
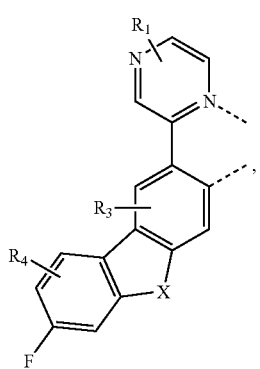
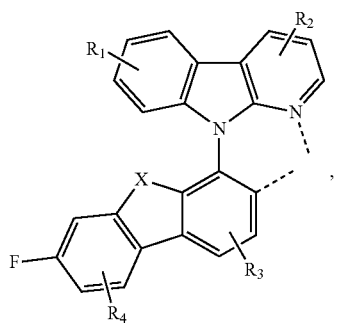

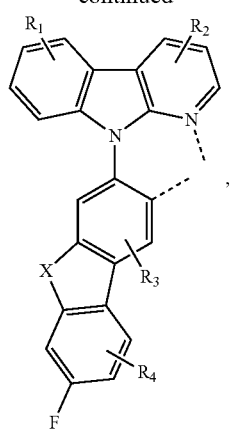
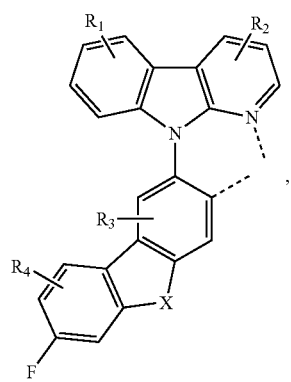
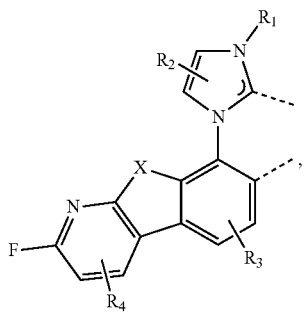
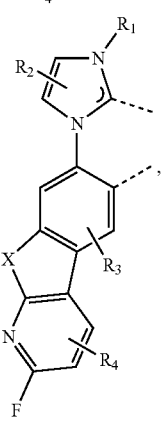
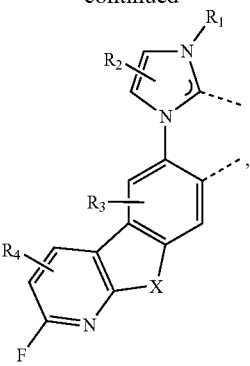
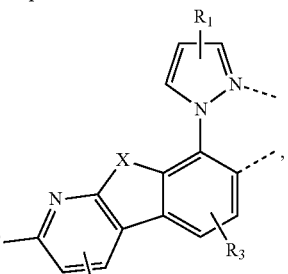
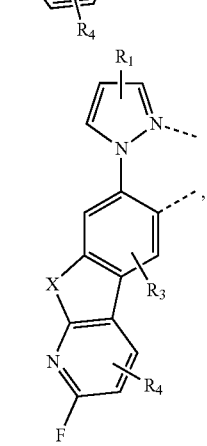
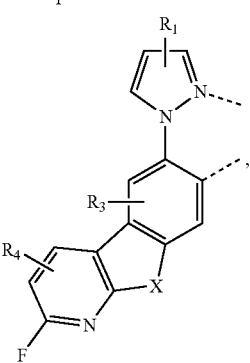
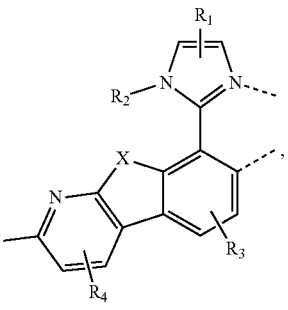

-continued
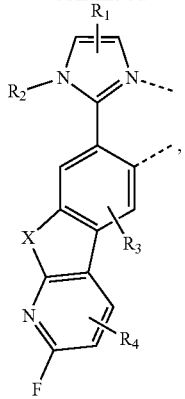
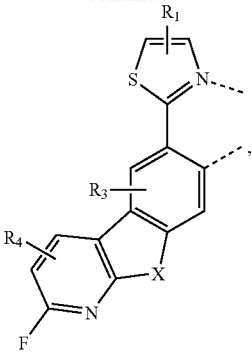

-continued

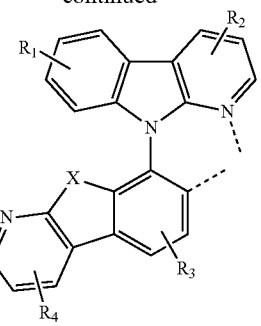
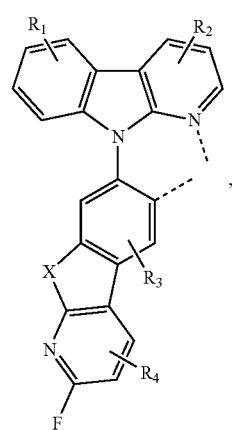
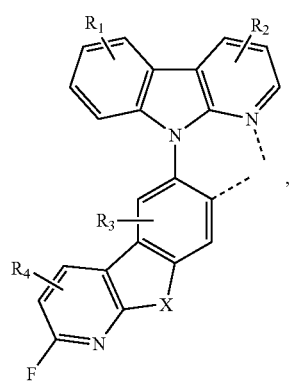
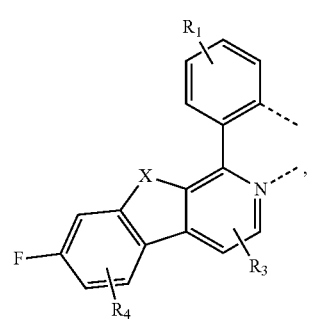
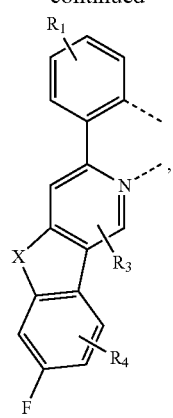
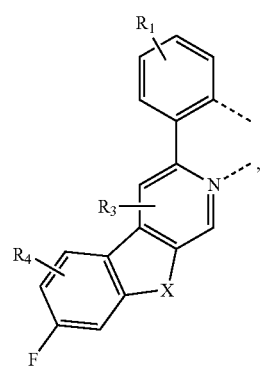
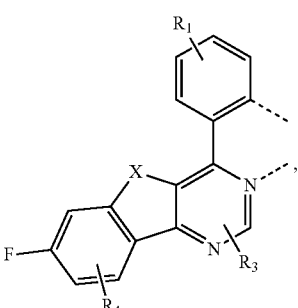
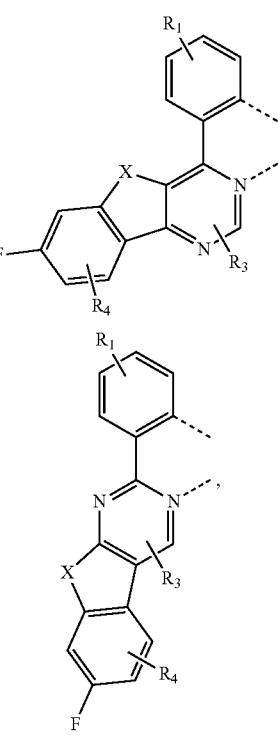

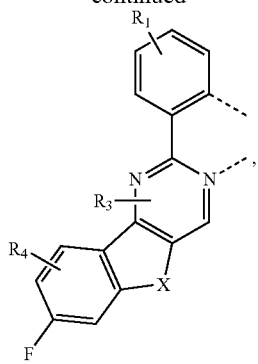
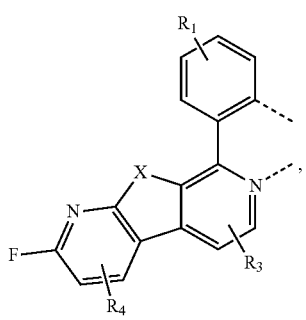
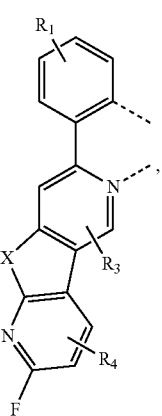
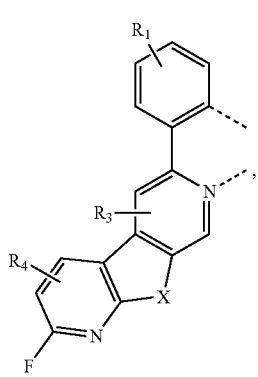
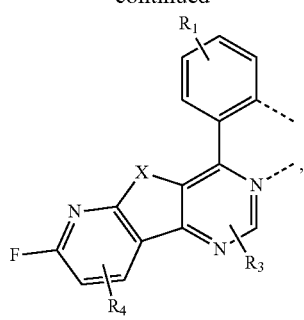
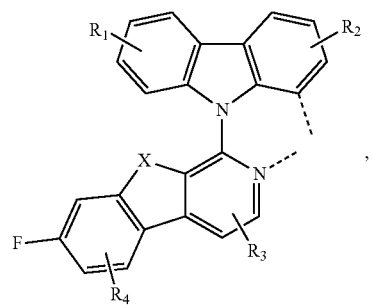
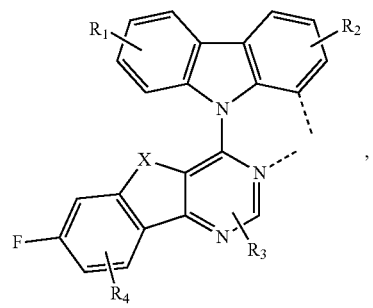
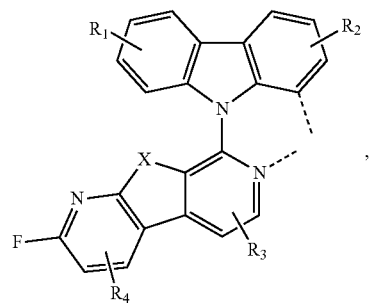
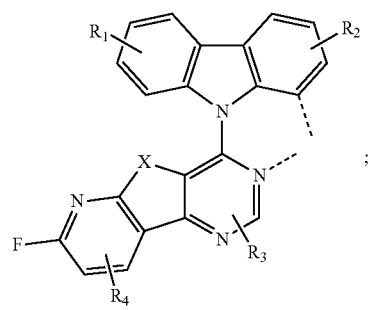
Wherein $L_b$ and $L_c$ are independently selected from the group consisting of:

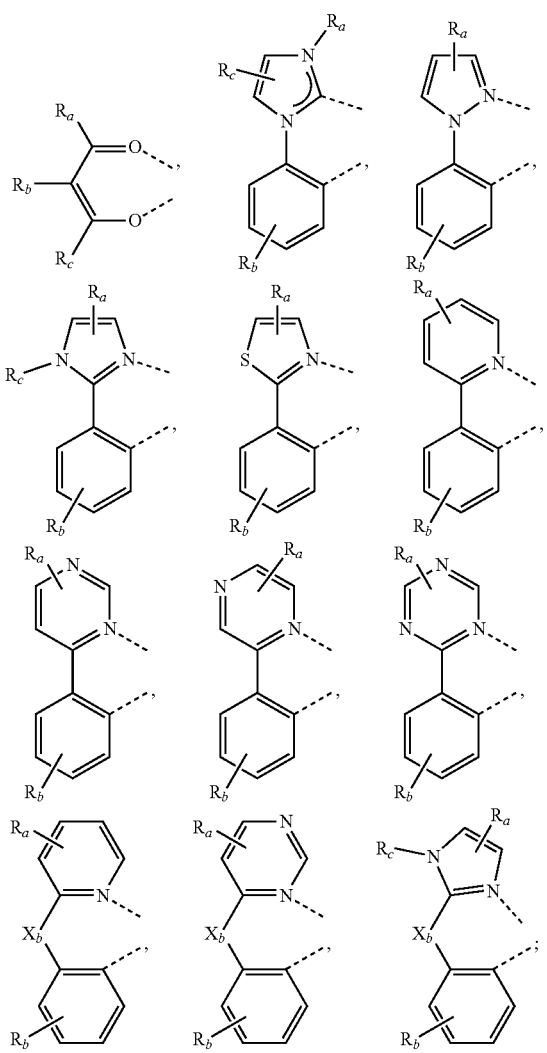

Wherein
$R_1$, $R_2$, $R_3$, $R_4$, $R_a$, $R_b$, and $R_c$ can represent mono, di, tri, or tetra substitution, or no substitution;

$X_b$ is selected from the group consisting of: O, S, Se, $NR_{N1}$ and $CR_{C1}R_{C2}$;

$R_1$, $R_2$, $R_3$, $R_4$, $R_a$, $R_b$, $R_c$, $R_{N1}$, $R_{C1}$ and $R_{C2}$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thioalkyl group, a sulfinyl group, a sulfonyl group, a phosphino group, and combinations thereof;

Two adjacent substitutions are optionally joined to form a ring.

In this embodiment, two adjacent substituents are optionally joined to form a ring which may comprise any of the following: in one case, for $R_1$, $R_2$, $R_3$, $R_4$, $R_a$, $R_b$, $R_c$, $R_{N1}$, $R_{C1}$ and $R_{C2}$, between these substituents with different numbers, two adjacent substitutions can be optionally joined to form a ring; in another case, when $R_1$, $R_2$, $R_3$, $R_4$, $R_a$, $R_b$, and $R_c$ represent di, tri, or tetra substitutions for a plurality of identically numbered substituents present in $R_1$, $R_3$, $R_4$, $R_a$, $R_b$, and $R_c$, two adjacent substitutions can be optionally joined to form a ring.

According to an embodiment of the present invention, wherein at least one of $X_1$ to $X_7$ is CR, and the R is selected from deuterium, halogen, a substituted or unsubstituted alkyl group having 1 to 20 carbon atoms, a substituted or unsubstituted cycloalkyl group having 3 to 20 ring carbon atoms, a substituted or unsubstituted aryl group having 6 to 30 carbon atoms, a substituted or unsubstituted heteroaryl group having 3 to 30 carbon atoms, or a nitrile group.

According to an embodiment of the present invention, wherein $X_1$ is CR, and the R is selected from deuterium, halogen, a substituted or unsubstituted alkyl group having 1 to 20 carbon atoms, a substituted or unsubstituted cycloalkyl group having 3 to 20 ring carbon atoms, a substituted or unsubstituted aryl group having 6 to 30 carbon atoms, a substituted or unsubstituted heteroaryl group having 3 to 30 carbon atoms, or a nitrile group.

According to an embodiment of the present invention, wherein $X_7$ is CR and the R is fluorine, substituted or unsubstituted methyl, or substituted or unsubstituted phenyl.

According to an embodiment of the present invention, wherein ligand $L_a$ is selected from $L_{a1}$ to $L_{a795}$ the specific structures of $L_{a1}$ to $L_{a795}$ are listed in claim 6.

According to an embodiment of the present invention, wherein ligand $L_a$ is selected from the group consisting of:

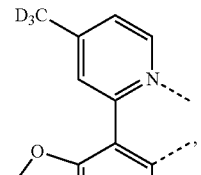

$D_3$-$L_{a110}$

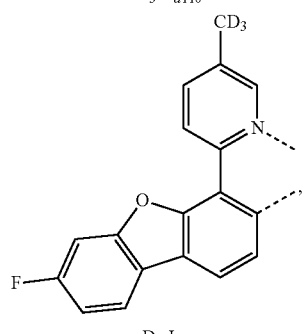

$D_3$-$L_{a126}$

-continued
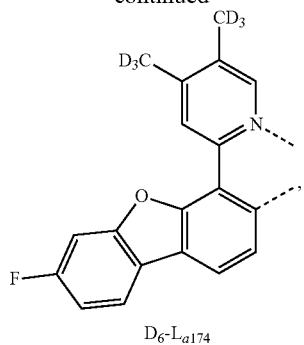
D6-La174
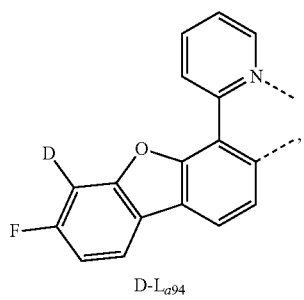
D-La94
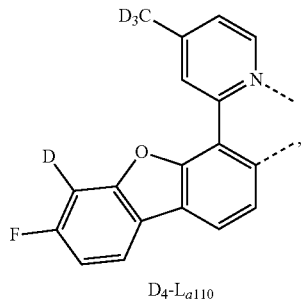
D4-La110
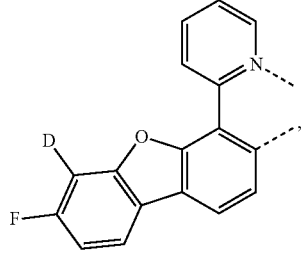
D4-La126
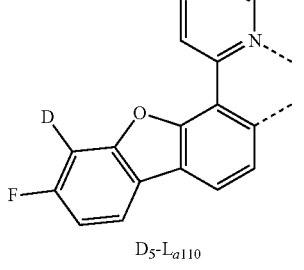
D5-La110
-continued
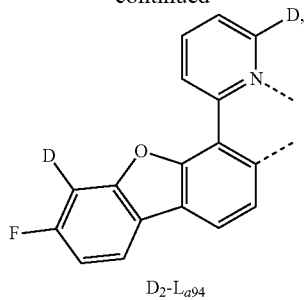
D2-La94
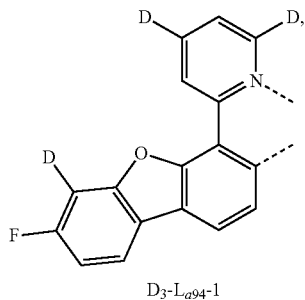
D3-La94-1
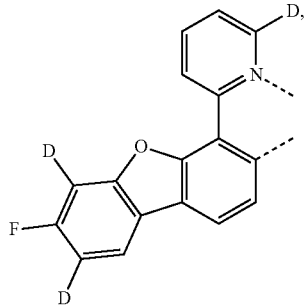
D3-La94-2
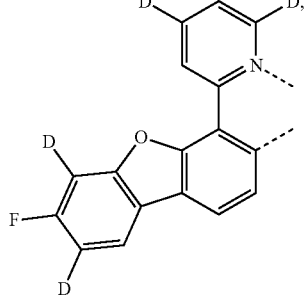
D4-La94
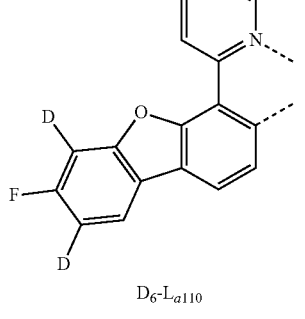
D6-La110

The deuterated $L_a$ of the specific structure listed in this embodiment are illustrative and non-limiting, and is not intended to limit the extent of partially or fully deuteration of $L_a$.

According to an embodiment of the present invention, wherein $L_{a1}$ to $L_{a795}$, $D_3$-$L_{a110}$, $D_3$-$L_{a126}$, $D_6$-$L_{a174}$, D-$L_{a94}$, $D_4$-$L_{a110}$, $D_4$-$L_{a126}$, $D_5$-$L_{a110}$, $D_2$-$L_{a94}$, $D_3$-$D_{a94}$-1, $D_3$-$L_{a94}$, $D_4$-$L_{a94}$, and $D_6$-$L_{a110}$ can be partially or fully deuterated.

According to another embodiment of the present invention, wherein the metal complex has a structure according to Formula 2 to Formula 9:

Formula 2

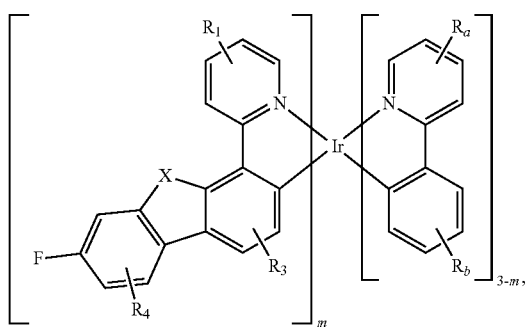

Formula 3

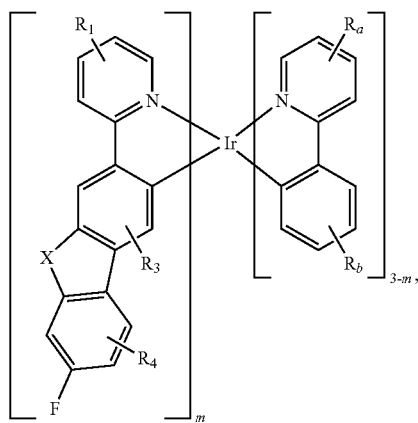

Formula 4

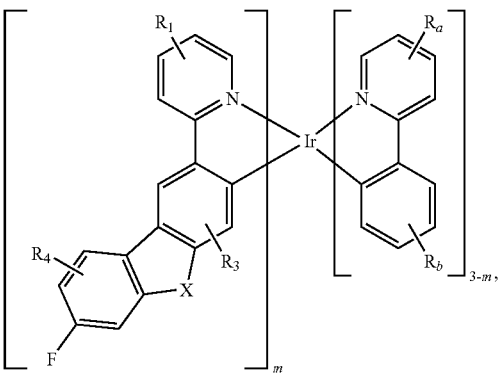

Formula 5

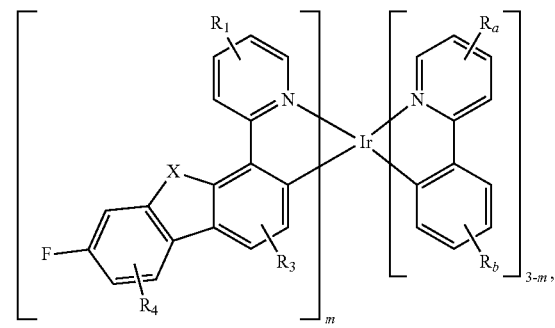

Formula 6

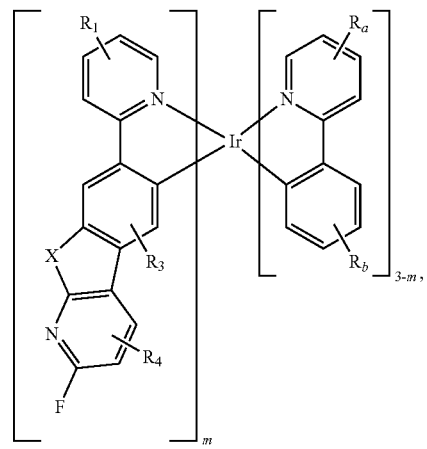

Formula 7

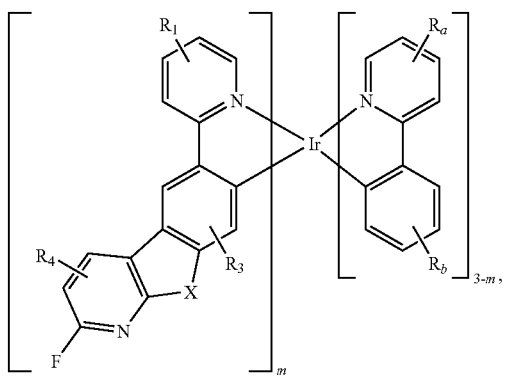

Formula 8

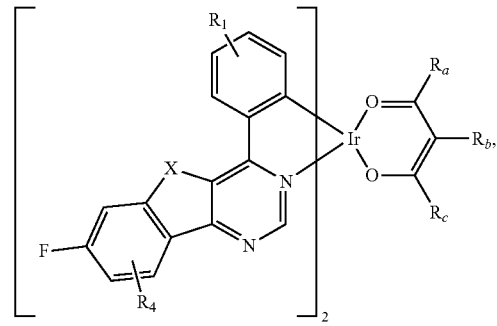

Formula 9

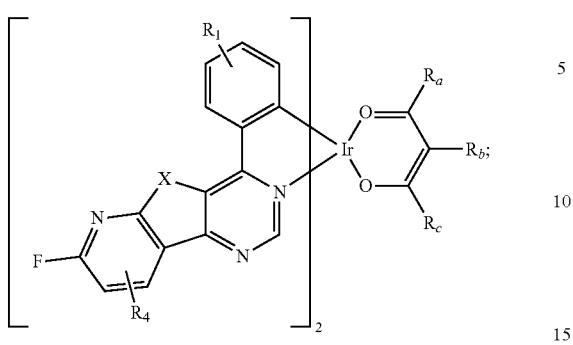

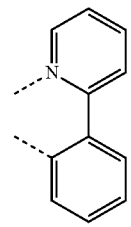 L_{b1}

Wherein m is 1, or 3; $R_1$, $R_3$, $R_4$, $R_a$, $R_b$, and $R_c$ can represent mono, di, tri, or tetra substitution, or no substitution;

$R_1$, $R_3$, $R_4$, $R_a$, $R_b$, and $R_c$ are each independently selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thioalkyl group, sulfinyl group, a sulfonyl group, a phosphino group, and combinations thereof;

Two adjacent substitutions are optionally joined to form a ring.

In this embodiment, two adjacent substituents are optionally joined to form a ring which may comprise any of the following: in one case, for $R_1$, $R_3$, $R_4$, $R_a$, $R_b$, and $R_c$ between these substituents with different numbers, two adjacent substitution can be optionally joined to form a ring; in another case, when $R_1$, $R_3$, $R_4$, $R_a$, and $R_b$ represent di, tri or tetra substitutions, for a plurality of identically numbered substituents present in $R_1$, $R_3$, $R_4$, $R_a$, and $R_b$ two adjacent substitutions can be optionally joined to form a ring.

According to another embodiment of the present invention, wherein the metal complex has the formula of $IrL_a(L_b)_2$, $L_a$ is selected from anyone of the group consisting of $L_{a1}$ to $L_{a795}$, $D_3$-$L_{a110}$, $D_3$-$L_{a126}$, $D_6$-$L_{a174}$, D-$L_{a94}$, $D_4$-$L_{a110}$, $D_4$-$L_{a126}$, $D_5$-$L_{a110}$, $D_2$-$L_{a94}$, $D_3$-$L_{a94}$-1, $D_3$-$L_{a94}$-1, $D_3$-$L_{a94}$-2, $D_4$-$L_{a94}$, and $D_6$-$L_{a110}$, $L_b$ is selected from anyone or both of the group consisting of:

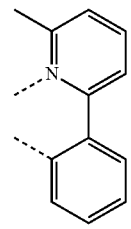 L_{b2}

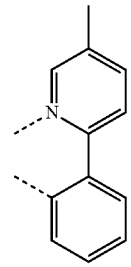 L_{b3}

L_{b4}

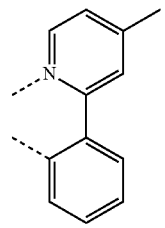 L_{b5}

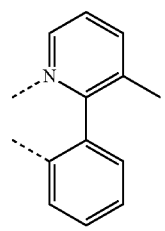 L_{b6}

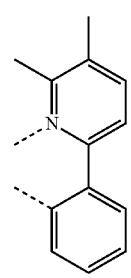

L_{b7}
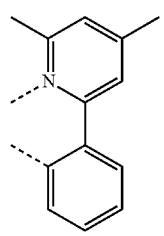
L_{b8}
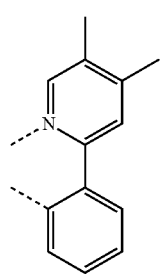
L_{b9}
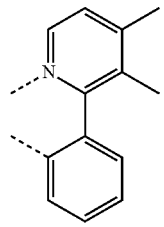
L_{b10}
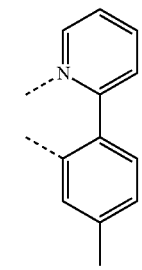
L_{b11}
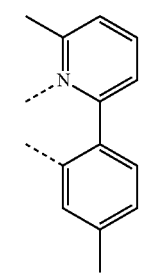
L_{b12}
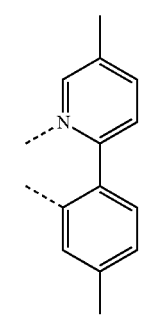
L_{b13}
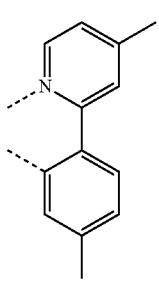
L_{b14}
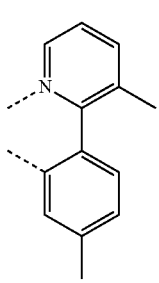
L_{b15}
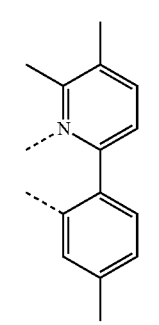
L_{b16}
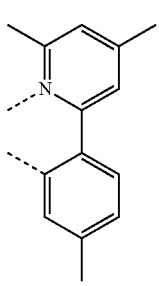
L_{b17}
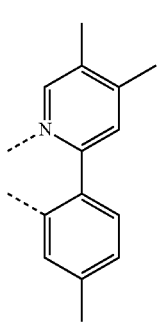

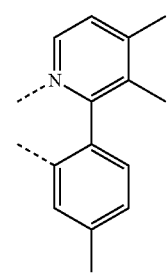
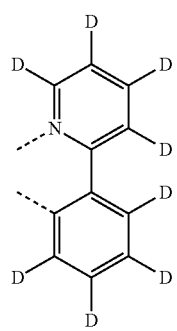
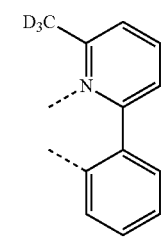 L_{b20}
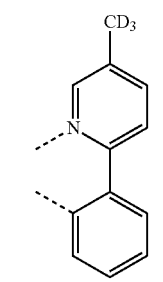 L_{b21}
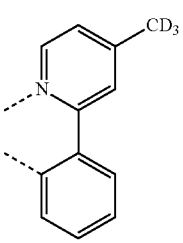 L_{b22}
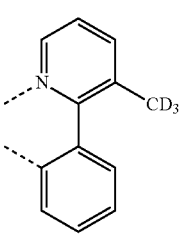 L_{b23}
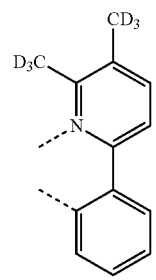 L_{b24}
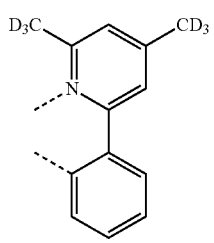 L_{b25}
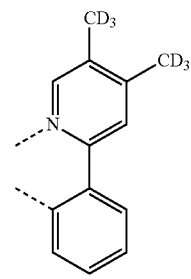 L_{b26}
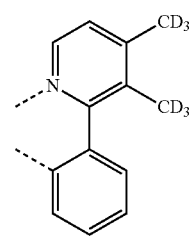 L_{b27}
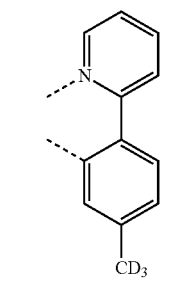 L_{b28}
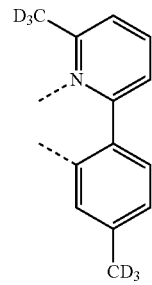 L_{b29}

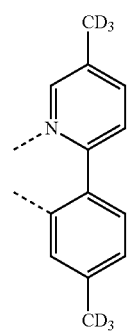 L_{b30}
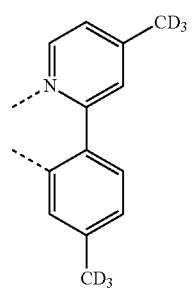 L_{b31}
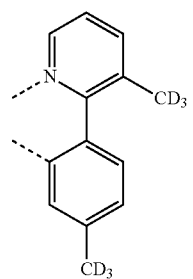 L_{b32}
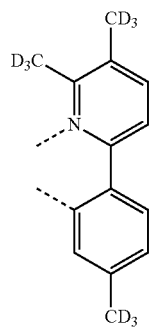 L_{b33}
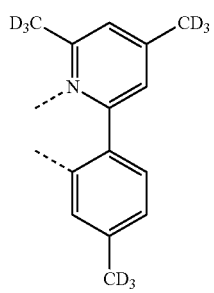 L_{b34}
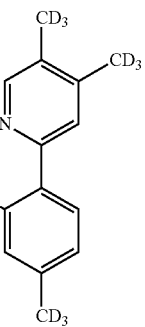 L_{b35}
L_{b36}
L_{b37}
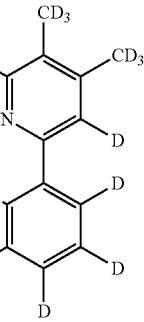 L_{b38}
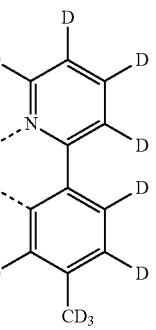 L_{b39}

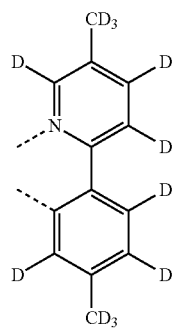
L$_{b40}$
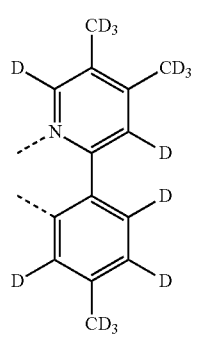
L$_{b41}$
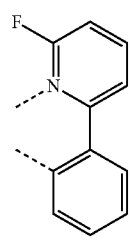
L$_{b42}$
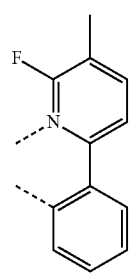
L$_{b43}$
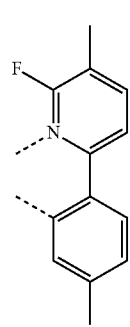
L$_{b44}$
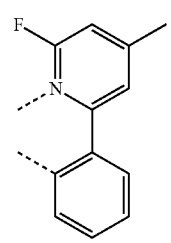
L$_{b45}$
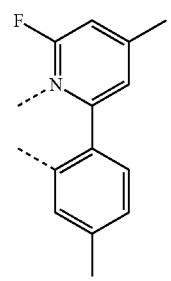
L$_{b46}$
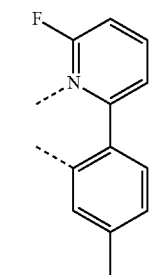
L$_{b47}$
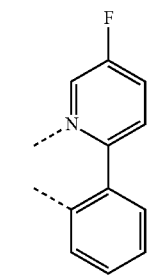
L$_{b48}$
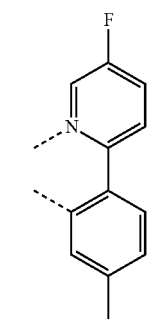
L$_{b49}$ -continued
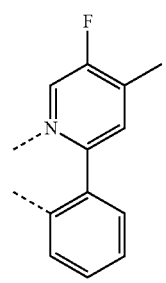 $L_{b50}$
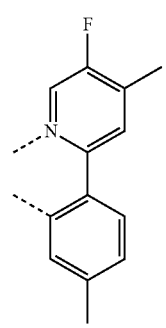 $L_{b51}$
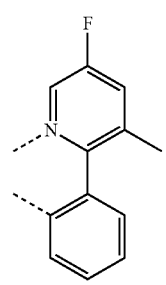 $L_{b52}$
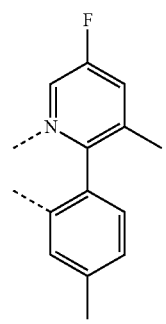 $L_{b53}$
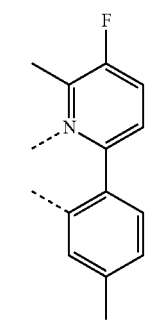 $L_{b54}$
-continued
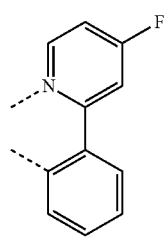 $L_{b55}$
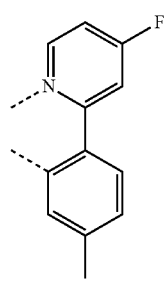 $L_{b56}$
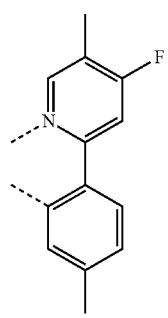 $L_{b57}$
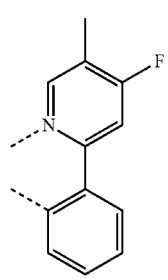 $L_{b58}$
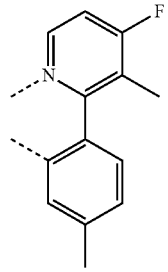 $L_{b59}$ -continued
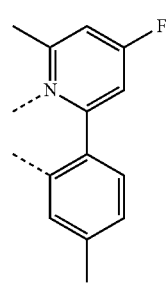 L<sub>b60</sub>
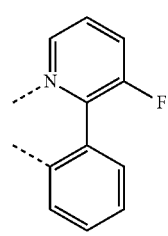 L<sub>b61</sub>
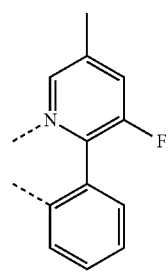 L<sub>b62</sub>
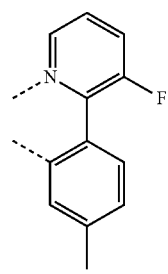 L<sub>b63</sub>
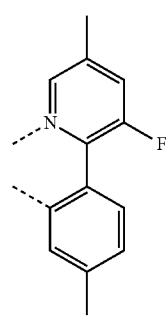 L<sub>b64</sub>
-continued
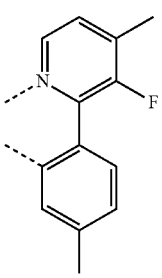 L<sub>b65</sub>
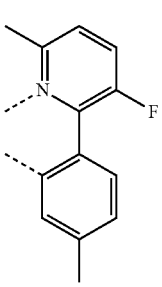 L<sub>b66</sub>
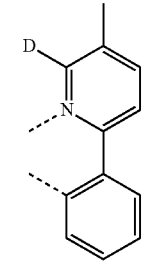 L<sub>b67</sub>
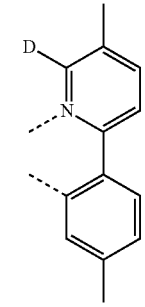 L<sub>b68</sub>
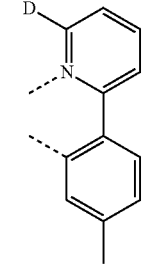 L<sub>b69</sub>

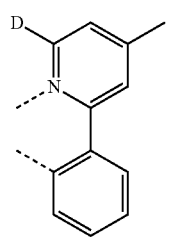 L<sub>b70</sub>
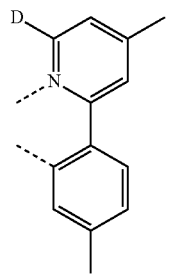 L<sub>b71</sub>
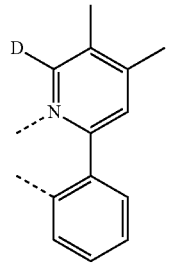 L<sub>b72</sub>
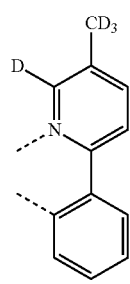 L<sub>b73</sub>
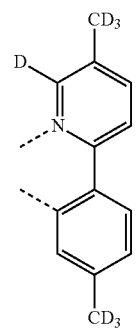 L<sub>b74</sub>
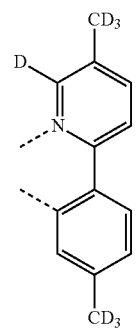 L<sub>b75</sub>
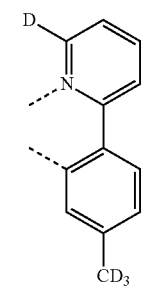 L<sub>b76</sub>
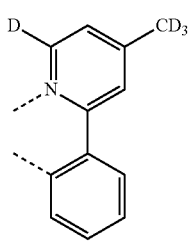 L<sub>b77</sub>
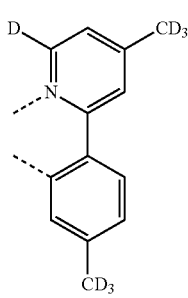 L<sub>b78</sub>
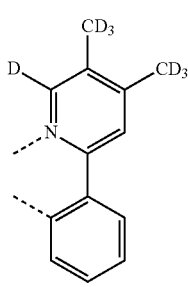 L<sub>b79</sub>

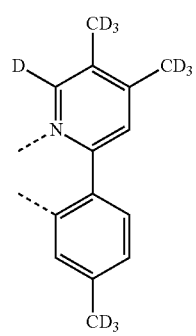
L<sub>b80</sub>
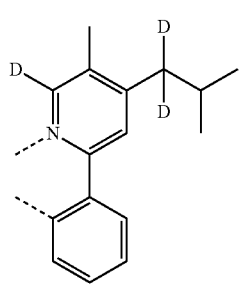
L<sub>b81</sub>
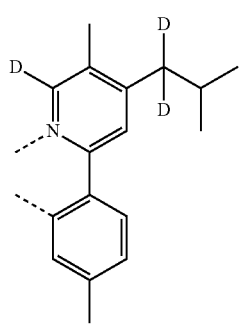
L<sub>b82</sub>
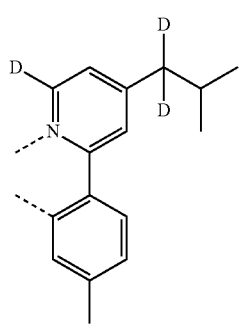
L<sub>b83</sub>
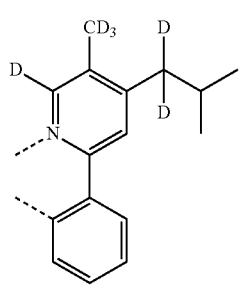
L<sub>b84</sub>
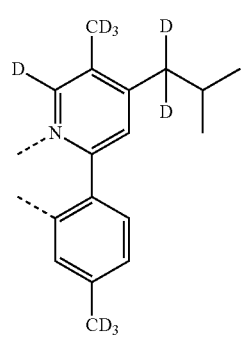
L<sub>b85</sub>
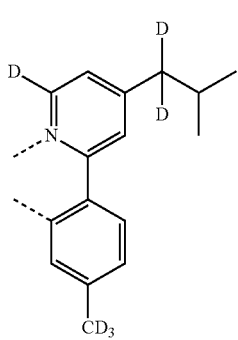
L<sub>b86</sub>
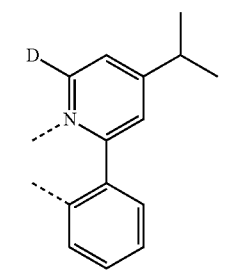
L<sub>b87</sub>
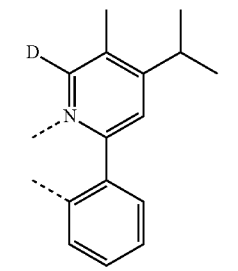
L<sub>b88</sub>
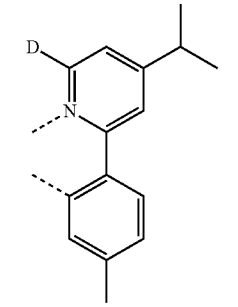
L<sub>b89</sub>

-continued

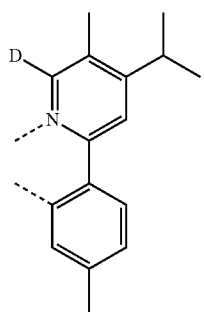
$L_{b90}$

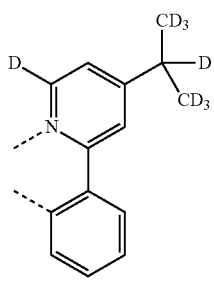
$L_{b91}$

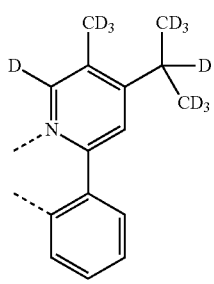
$L_{b92}$

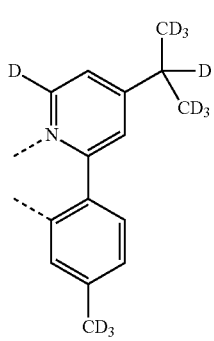
$L_{b93}$

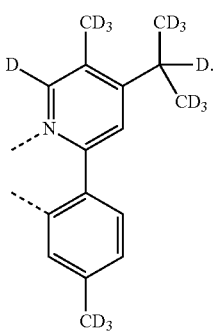
$L_{b94}$

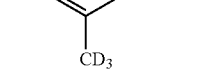

According to another embodiment of the present invention, wherein the metal complex has the formula of $Ir(L_a)_2 L_b$, $L_a$ is selected from anyone or both of the group consisting of $L_{a1}$ to $L_{a795}$, $D_3$-$L_{a110}$, $D_3$-$L_{a126}$, $D_6$-$L_{a174}$, D-$L_{a94}$, $D_4$-$L_{a110}$, $D_4$-$L_{a126}$, $D_5$-$L_{a110}$, $D_2$-$L_{a94}$, $D_3$-$L_{a94}$-1, $D_3$-$L_{a94}$-2, $D_4$-$L_{a94}$, and $D_6$-$L_{a110}$, $L_b$ is selected from anyone of the group consisting of $L_{b1}$ to $L_{b94}$.

According to another embodiment of the present invention, wherein the metal complex has the formula of $Ir(L_a)_2 L_c$, $L_a$ is selected from anyone or both of the group consisting of $L_{a1}$ to $L_{a795}$, $D_3$-$L_{a110}$, $D_3$-$L_{a126}$, $D_6$-$L_{a174}$, D-$L_{a94}$, $D_4$-$L_{a110}$, $D_4$-$L_{a126}$, $D_5$-$L_{a110}$, $D_2$-$L_{a94}$, $D_3$-$L_{a94}$-1, $D_3$-$L_{a94}$-2, $D_4$-$L_{a94}$, $D_6$-$L_{a110}$, $L_c$ is selected from anyone of the group consisting of:

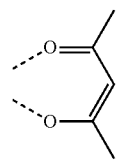
$L_{c1}$

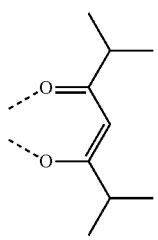
$L_{c2}$

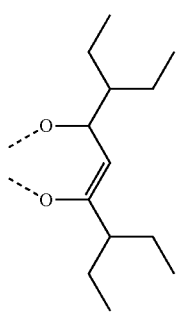
$L_{c3}$

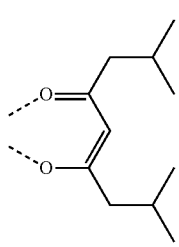
$L_{c4}$

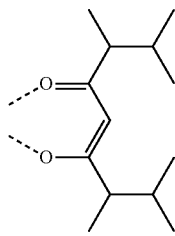
$L_{c5}$

L_{c6}
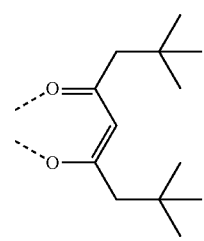
L_{c7}
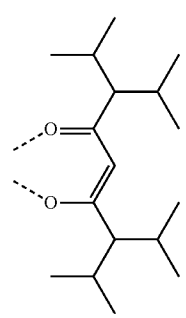
L_{c8}
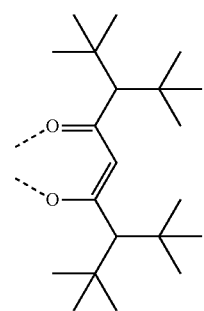
L_{c9}
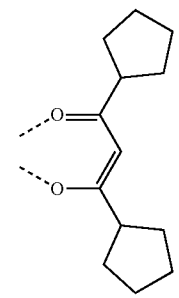
L_{c10}
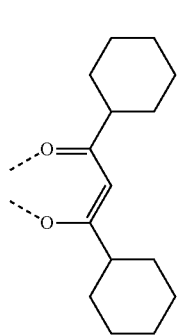
L_{c11}
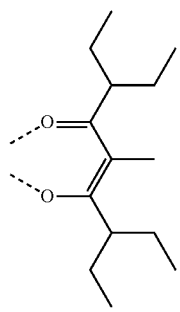
L_{c12}
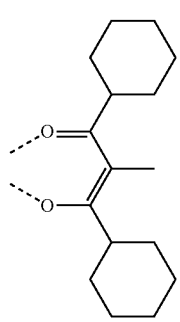
L_{c13}
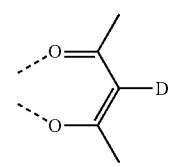
L_{c14}
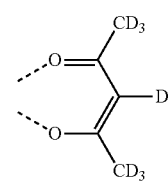
L_{c15}
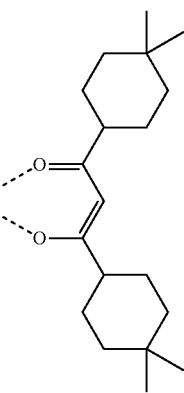

$L_{c16}$
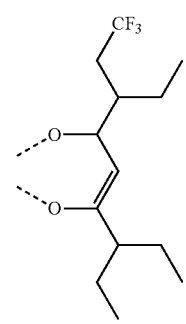

$L_{c17}$
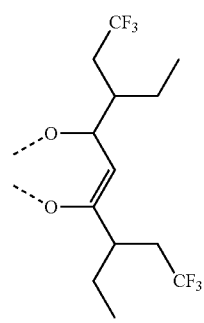

$L_{c18}$
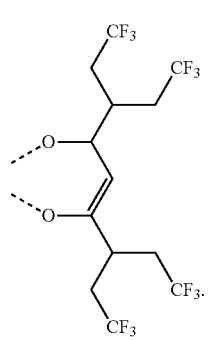

According to another embodiment of the present invention, wherein the metal complex has the formula of $IrL_a(L_c)_2$, $L_a$ is selected from anyone of the group consisting of $L_{a1}$ to $L_{a795}$, $D_3$-$L_{a110}$, $D_3$-$L_{a126}$, $D_6$-$L_{a174}$, $D$-$L_{a94}$, $D_4$-$L_{a110}$, $D_4$-$L_{a126}$, $D_5$-$L_{a110}$, $D_2$-$L_{a94}$, $D_3$-$L_{a94}$-1, $D_3$-$L_{a94}$-2, $D_4$-$L_{a94}$, and $D_6$-$L_{a110}$, $L_c$ is selected from anyone or both of the group consisting of $L_{c1}$ to $L_{c18}$.

In some embodiments of the present invention, the metal complex of the present invention does not comprise a ligand of the following structure:

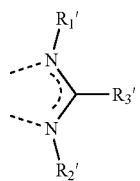

wherein $R_1'$ and $R_2'$ are independently selected from the group consisting of a substituted or unsubstituted alkyl group having 1 to 10 carbon atoms, a substituted or unsubstituted alkoxy group having 1 to 10 carbon atoms, a substituted or unsubstituted aryl group having 6 to 25 carbon atoms, and a substituted or unsubstituted heteroaryl group having 3 to 18 carbon atoms; $R_3'$ is selected from the group consisting of a substituted or unsubstituted alkyl group having 1 to 10 carbon atoms, a substituted or unsubstituted alkoxy group having 1 to 10 carbon atoms, a substituted or unsubstituted alkylsilyl group having 1 to 10 carbon atoms, a substituted or unsubstituted aryl group having 6 to 25 carbon atoms, a substituted or unsubstituted heteroaryl group having 3 to 18 carbon atoms, and a substituted or unsubstituted amino group having 2 to 20 carbon atoms. In some cases, the metal complex of the present invention does not comprise a complex of the following structure:

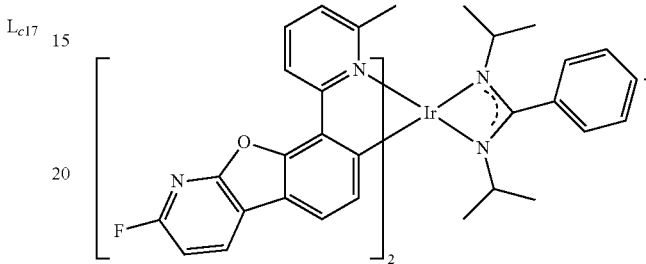

According to an embodiment of the present invention, an electroluminescent device is also disclosed which comprises an anode, a cathode, and an organic layer, disposed between the anode and the cathode, the organic layer comprising a metal complex comprising a partial structure represented by Formula 1:

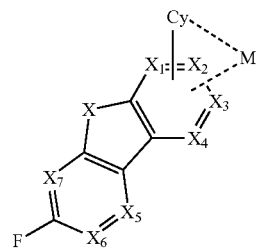

Formula 1

Wherein Cy is a substituted or unsubstituted carbocyclic group or heterocyclic group having 5 to 24 aromatic ring atoms;
Wherein Cy is combined with M by a metal-carbon bond or a metal-nitrogen bond;
Wherein M is selected from the group consisting of copper (Cu), silver (Ag), gold (Au), rhodium (Rh), ruthenium (Ru), palladium (Pd), osmium (Os), iridium (Ir), and platinum (Pt);
Wherein X is selected from O, S or Se;
Wherein $X_1$ to $X_7$ are independently selected from the group consisting of N or CR;
Wherein R is selected from the group consisting of hydrogen, deuterium, halogen, a substituted or unsubstituted alkyl group having 1 to 20 carbon atoms, a substituted or unsubstituted cycloalkyl group having 3 to 20 ring carbon atoms, a substituted or unsubstituted heteroalkyl group having 1 to 20 carbon atoms, a substituted or unsubstituted arylalkyl group having 7 to 30 carbon atoms, a substituted or unsubstituted alkoxy group having 1 to 20 carbon atoms, a substituted or unsubstituted aryloxy group having 6 to 30 carbon atoms, a substituted or unsubstituted alkenyl group having 2 to 20 carbon atoms, a substituted or unsubstituted aryl group having 6 to 30 carbon atoms, a substituted or unsubstituted heteroaryl group having 3 to 30 carbon atoms, a substituted or unsubstituted alkylsilyl group having 3 to 20 carbon atoms, a substituted or unsubstituted arylsilyl group having 6 to 20 carbon atoms, a substituted or unsubstituted amino group having 0 to 20 carbon atoms, an acyl group, a carbonyl group, a carboxylic acid group, an ester group, a nitrile group, an isonitrile group, a thioalkyl group, a sulfinyl group, a sulfonyl group, a phosphine group, and combinations thereof;

Two adjacent substitution are optionally joined to form a ring;

$X_1$, $X_2$, $X_3$, or $X_4$ is connected to M by a metal-carbon bond or a metal-nitrogen bond.

According to an embodiment of the present invention, wherein the organic layer is an emissive layer and the metal complex is an emitter.

According to an embodiment of the present invention, wherein the organic layer further comprises a host. In some embodiments, the organic layer comprise at least two hosts is preferable. In some embodiment, the host used may be a) bipolar, b) electron transport, c) hole transport, or d) wide band gap material which plays a tiny role in charge transport. In some embodiment, the host may comprise a metal complex. The host may be an aromatic ring or heteroaryl ring compound. Any substituent of the host can independently selected from the group consisting of: $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv C-C_nH_{2n+1}$, $Ar_1$, $Ar_1-Ar_2$ and $C_nH_{n2}-Ar_1$. Or the host does not have a substituent. In the aforementioned substituents, n can vary from 1 to 10; and $Ar_1$ and $Ar_2$ are independently selected from the group consisting of: benzene, biphenyl, naphthalene, triphenylene, carbazole and its heteroaromatic analogue. The host may be inorganic compound, such as inorganic material containing Zn, like ZnS.

According to an embodiment of the present invention, wherein the organic layer comprises at least two hosts.

According to an embodiment of the present invention, wherein the organic layer further comprises a host compound, wherein the host compound comprises at least one the chemical groups selected from the group consisting of: benzene, biphenyl, carbazole, azacarbazole, indolocarbazole, dibenzothiophene, dibenzofuran, dibenzoselenophene, triphenylene, fluorene, silafluorene, naphthalene, phenanthrene, pyridine, pyrimidine, triazine, quinazoline, quinoxaline, azadibenzothiophene, azadibenzofuran, azadibenzoselenophene, azatriphenylene, aza-phenanthrene and the combinations thereof. The host may comprise a metal complex. The host may be (but is not limited to) a particular compound selected from the group consisting of:

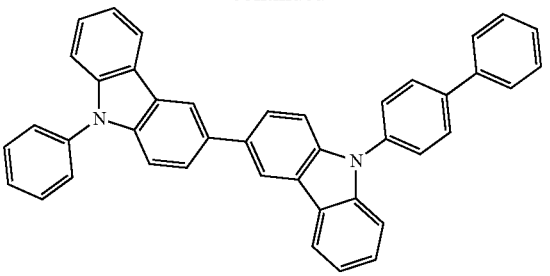

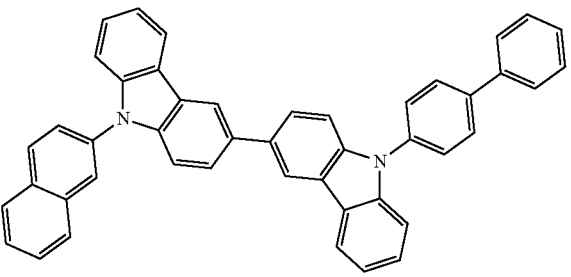

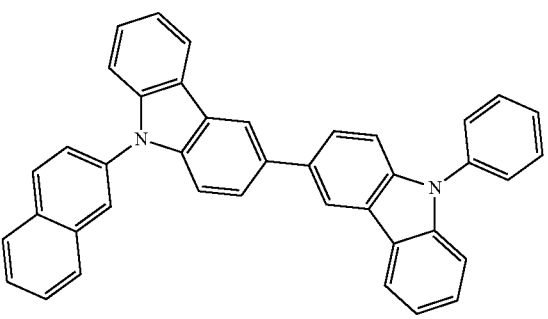

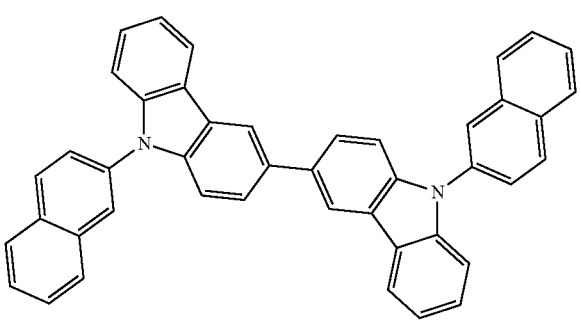

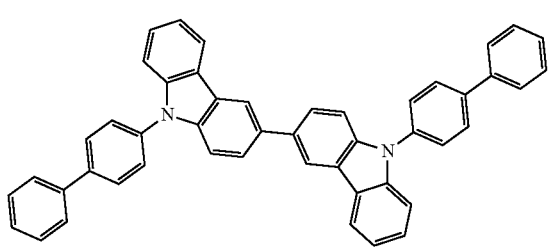

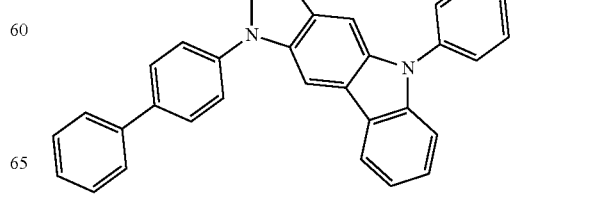

-continued
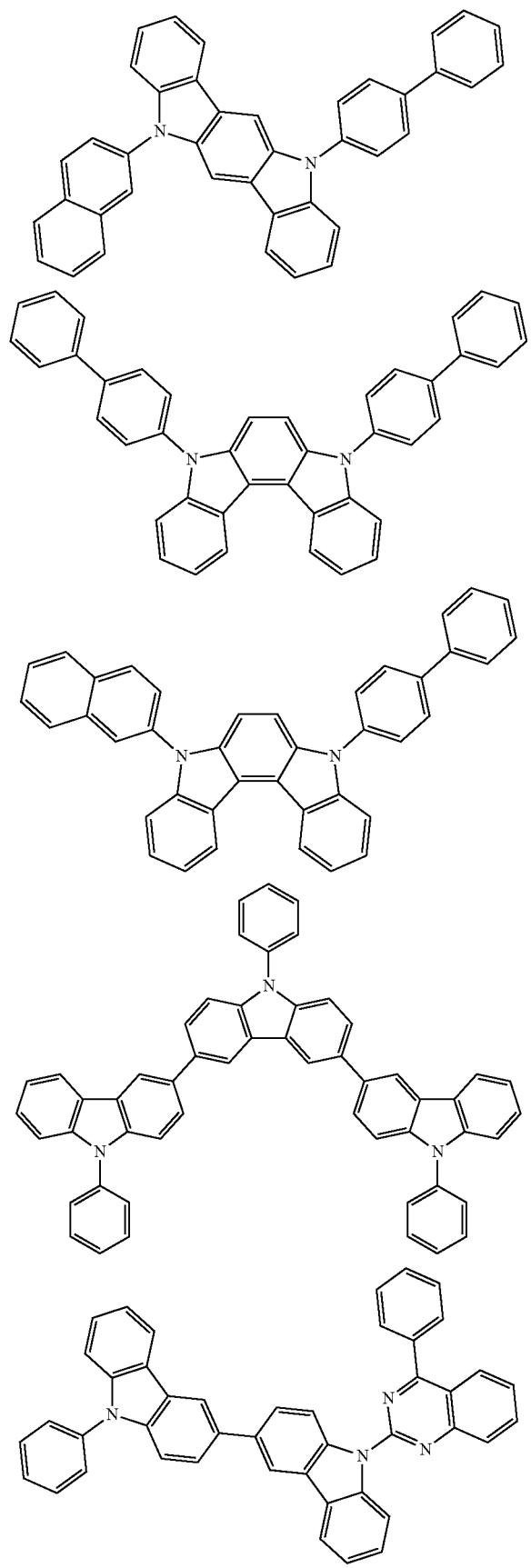
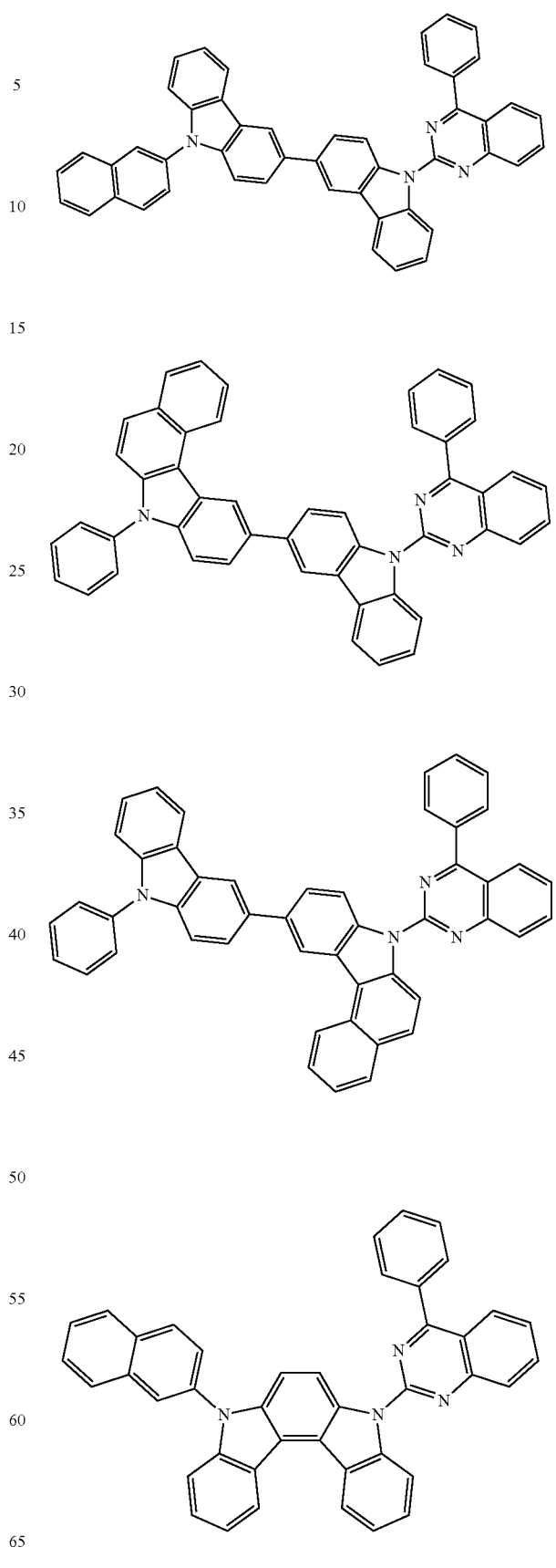

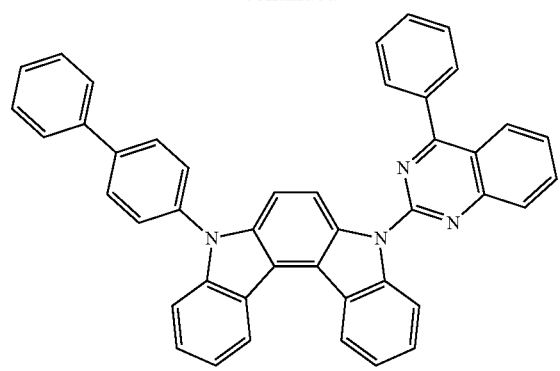
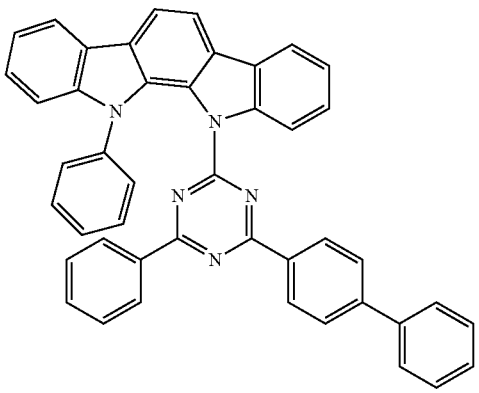
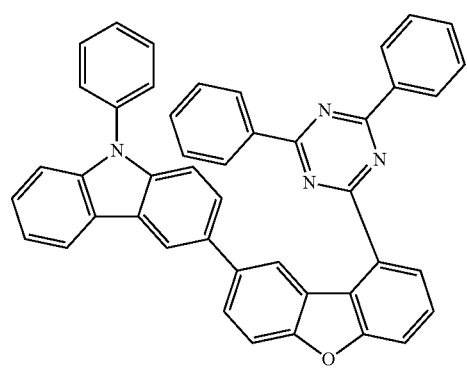
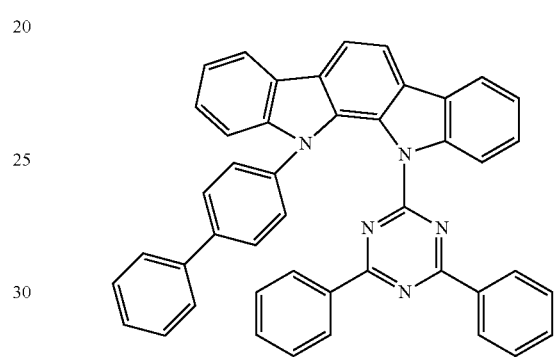
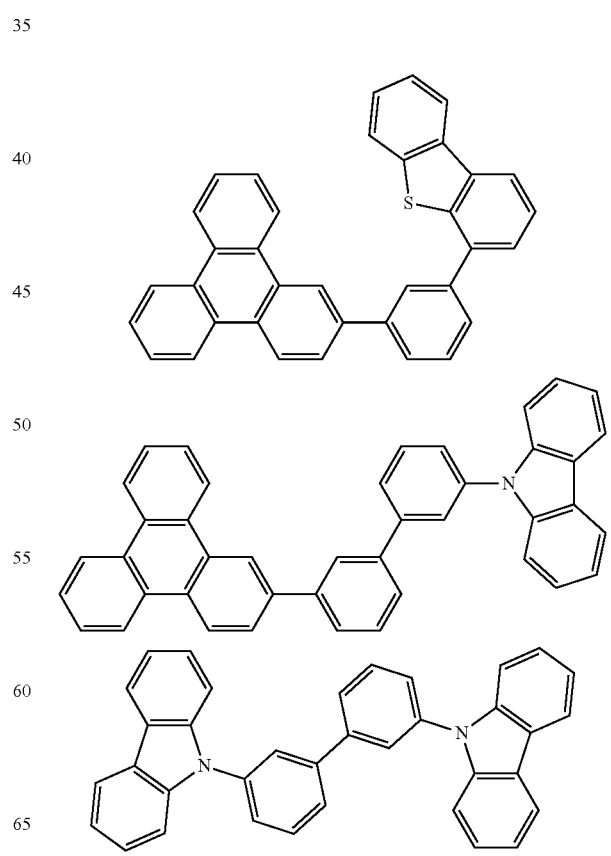

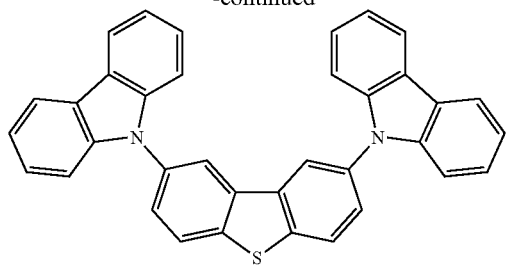

According to an embodiment of the present invention, wherein the electroluminescent device is incorporated into another device selected from the group consisting of: a consumer product, an electronic component module, an organic light-emitting device, and a lighting panel.

According to yet another embodiment, a formulation comprising a metal complex comprising a partial structure represented by Formula 1 is also disclosed. The specific structure of Formula 1 is described in any of the above embodiments.

Combination with Other Materials

The materials described herein as useful for a particular layer in an organic light emitting device may be used in combination with a wide variety of other materials present in the device. The combinations of these materials are described in more detail in U.S. Pat. App. No. 20160359122A1 at paragraphs 0132-0161, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials are described in detail in paragraphs 0080-0101 of U.S. Pat. App. No. 20150349273, which are incorporated by reference in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatography-mass spectrometer produced by SHIMADZU, gas chromatography-mass spectrometer produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Materials Synthesis Examples:

The method for preparing the metal complex of the present invention is not limited. The following compounds are exemplified as a typical but non-limiting example, and the synthesis route and preparation method are as follows:

Synthesis Example 1: Synthesis of Ir(L$_{a94}$)(L$_{b1}$)$_2$

Step 1:

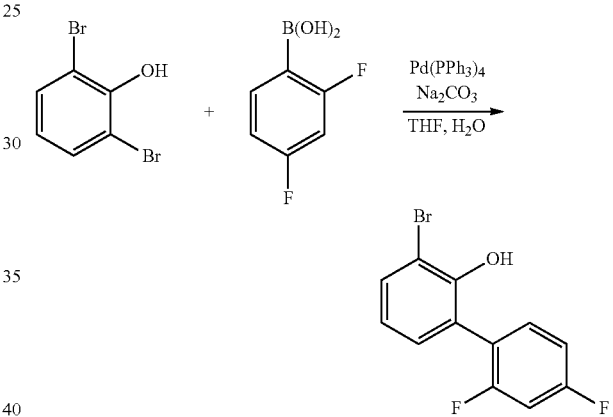

2,4-difluorobenzeneboronic acid (11.9 g, 75.4 mmol), 2,6-dibromophenol (20.0 g, 79.4 mmol), Pd(PPh$_3$)$_4$ (2.7 g, 2.4 mmol), sodium carbonate (14.4 g, 136.0 mmol), THF (500 mL) and H$_2$O (50 mL) were added to a 1000 mL round-bottomed flask. N$_2$ replacement three times and N$_2$ protection. Then put into a heating jacket, stir and reflux for 12 h. The solution was cooled to room temperature, extracted with EA and washed with brine three times, dried with anhydrous magnesium sulfate, the combined organic layers were concentrated. The crude product was purified by column-chromatography, eluting with 10% (v/v) EA/PE to obtain 3-bromo-2',4'-difluoro-[1,1'-biphenyl]-2-ol as white solid (18.3 g, 88% yield), Step 2:

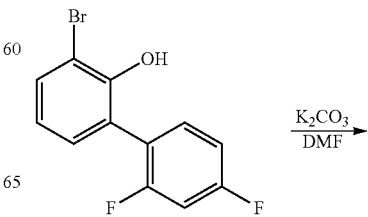

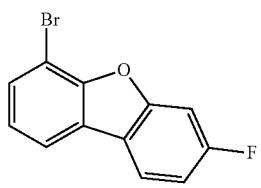

3-bromo-2′,4′-difluoro-[1,1′-biphenyl]-2-ol (18.6 g, 48.0 mmol), potassium carbonate (20.0 g, 146.0 mmol) and DMF (200 mL) were added to a 500 mL round-bottomed flask then put into a heating jacket, stirred at 100° C. for 12 hours. The solution was cooled to room temperature, filtered with diatomite, extracted with EA twice and washed with brine, dried with anhydrous magnesium sulfate, the combined organic layers were concentrated. The crude product was purified by column-chromatography, eluting with PE:EA=50:1 (v/v) to obtain 6-bromo-3-fluorodibenzo[b,d]furan (8.6 g, 68% yield).

Step 3:

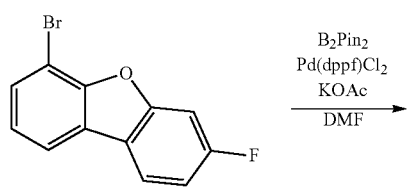

6-bromo-3-fluorodibenzo[b,d]furan (8.6 g, 32.7 mmol), bis(pinacolato)diboron (10.0 g, 39.2 mmol), Pa(dppf)Cl$_2$ (1.7 g, 1.6 mmol), potassium acetate 17.6 g, 71.9 mmol) and DMF (150 mL) were added to a 500 mL round-bottomed flask, N$_2$ replacement three times and N$_2$ protection, stirred at 100° C. overnight. After the reaction was finished, extracted with EA and washed with brine three times, dried with anhydrous magnesium sulfate, the combined organic layers were concentrated. The crude product was purified by column chromatography, eluting with PE:EA-30:1 to 20:1 (v/v) to obtain 3-fluoro-6-(4,4,5,5-tetramethyl-1,3-dioxolan-2-yl)dibenzo[b,d]furan as a white solid (7.3 g, 72% yield).

Step 4:

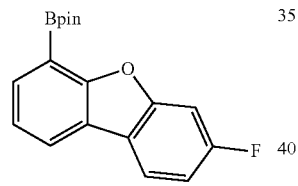 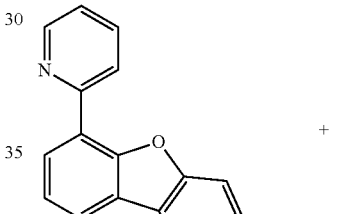

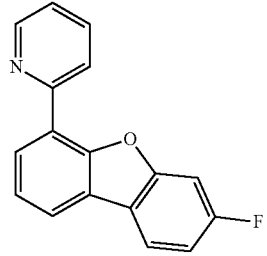

3-fluoro-6-(4,4,5,5-tetramethyl-1,3-dioxolan-2-yl)dibenzo[b,d]furan (7.3 g, 23.4 mmol), 2-bromopyridine (3.7 g, 23.4 mmol), Pd(PPh$_3$)$_4$ (1.4 g, 1.2 mmol), sodium carbonate (5.5 g, 51.5 mmol), THF (100 mL) and H$_2$O (20 mL) were added to a 500 mL round-bottomed flask. N$_2$ replacement three times and N$_2$ protection, stirred at 85° C. for 12 h. After the reaction was finished, extracted with EA and washed with brine three times, dried with anhydrous magnesium sulfate, the combined organic layers were concentrated. The crude product was purified by column chromatography, eluting with PE:EA=20:1 to 10:1 (v/v) to obtain 2-(7-fluorodibenzo[b,d]furan-4-yl)pyridine as a white solid (5.6 g, 90% yield).

Step 5:

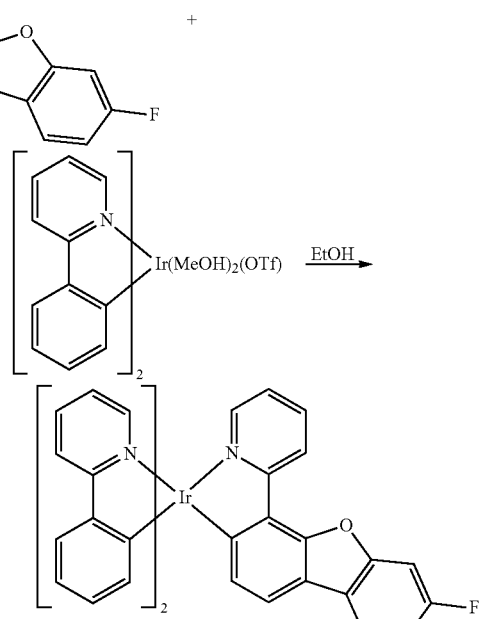

compound Ir(L$_{a94}$)(L$_{b1}$)$_2$ 2-(7-fluorodibenzo[b,d]furan-4-yl)pyridine (2.9 g, 11.0 mmol), iridium complex (4.0 g, 5.5 mmol) and ethanol (250 mL) were added to a 500 mL round-bottomed flask. N$_2$ replacement three times and N$_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(L$_{a94}$)(L$_{b1}$)$_2$ (1.5 g, 36% yield). The product was confirmed as the target product, with a molecular weight of 763.

Synthesis Example 2: Synthesis of Ir(La$_{110}$)(L$_{b1}$)$_2$

Step 1:

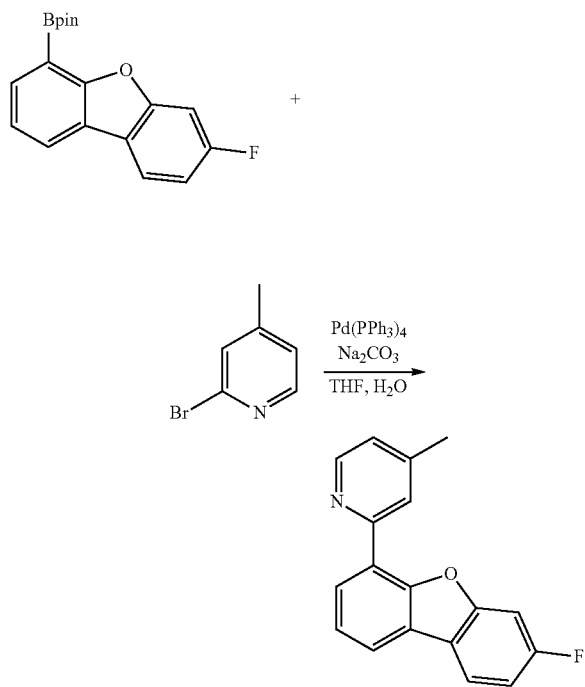

Intermediate 1

3-fluoro-6-(4,4,5,5-tetramethyl-1,3-dioxolan-2-yl)dibenzo[b,d]furan (7.3 g, 23.4 mmol), 2-bromo-4-methylpyridine (4.3 g, 23.4 mmol), Pd(PPh$_3$)$_4$ (1.4 g, 1.2 mmol), sodium carbonate (5.5 g, 51.5 mmol), THF (100 mL) and H$_2$O (20 mL) were added to a 500 mL round-bottomed flask. N$_2$ replacement three times and N$_2$ protection, stirred at 85° C. for 12 h. After the reaction was finished, extracted with EA and washed with brine three times, dried with anhydrous magnesium sulfate, the combined organic layers were concentrated. The crude product was purified by column chromatography, eluting with PE:EA-20:1 to 10:1 (v/v) to obtain intermediate 1 (5.6 g, 90% yield).

Step 2:

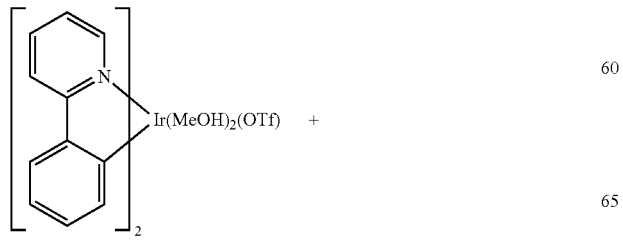

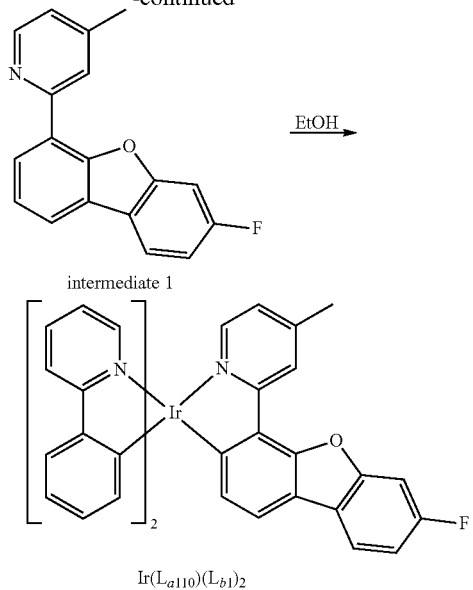

Ir(L$_{a110}$)(L$_{b1}$)$_2$

Intermediate 1 (3.1 g, 11.0 mmol), iridium complex (4.0 g. 5.5 mmol) and ethanol (250 mL) were added to a 500 mL round-bottomed flask. N$_2$ replacement three times and N$_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(La$_{110}$)(L$_{b1}$)$_2$ (1.5 g, 32% yield). The product was confirmed as the target product, with a molecular weight of 777.

Synthesis Example 3: Synthesis of Ir(L$_{a110}$)(L$_{b3}$)$_2$

Step 1:

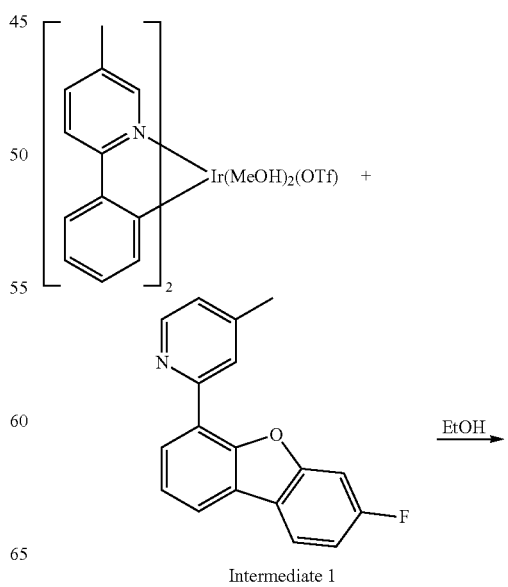

Intermediate 1

-continued

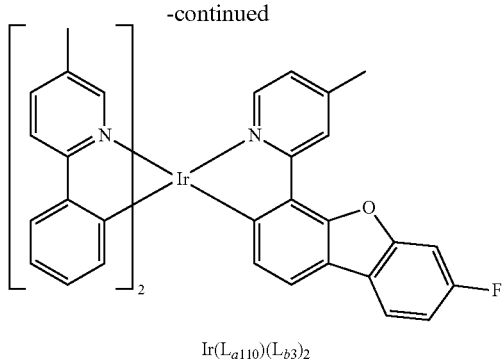

Ir(L$_{a110}$)(L$_{b3}$)$_2$

Intermediate 1 (2.0 g, 7.2 mmol), iridium complex (3.6 g, 4.8 mmol) and ethanol (250 mL) were added to a 500 mL round-bottomed flask. N$_2$ replacement three times and N$_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(L$_{a110}$)(L$_{b3}$)$_2$ (1.5 g, 33% yield). The product was confirmed as the target product, with a molecular weight of 805.

Synthesis Example 4: Synthesis of Ir(D$_4$-L$_{a110}$)(L$_{b1}$)$_2$

Step 1:

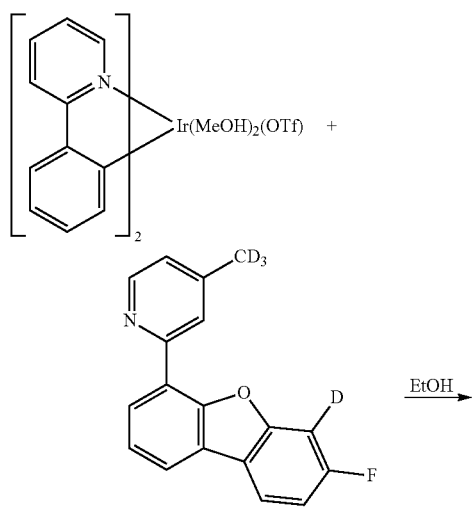

Intermediate 2

Ir(D$_4$-L$_{a110}$)(L$_{b1}$)$_2$

Intermediate 2 (2.4 g, 8.6 mmol), iridium complex (4.4 g, 6.1 mmol) and ethanol (250 mL) were added to a 500 mL round-bottomed flask. N$_2$ replacement three times and N$_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(D$_4$-L$_{a110}$)(L$_{b1}$)$_2$ (1.6 g, 34% yield). The product was confirmed as the target product, with a molecular weight of 781.

Synthesis Example 5: Synthesis of Ir(D$_4$-L$_{a110}$)(L$_{b1}$)$_2$

Step 1:

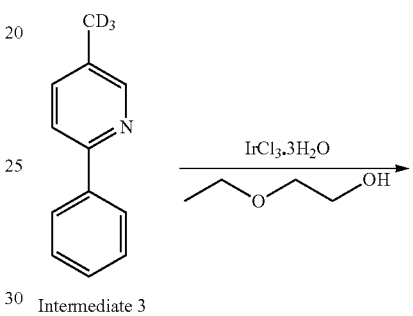

Intermediate 3

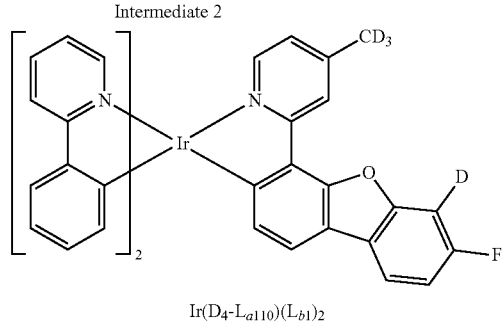

Intermediate 4

Intermediate 3 (8.0 g, 46.5 mmol), IrCl$_3$·3H$_2$O (3.1 g, 11.1 mmol) and glycol ether (100 mL) and H$_2$O (30 mL) were added to a 250 mL round-bottomed flask. N$_2$ replacement three times and N$_2$ protection, stirred at 130° C. for 24 h. After the reaction cooled, filtered and washed with methanol, then drain under vacuum pump to obtain Intermediate 4 as yellow solid (3.4 g, 96% yield).

Step 2:

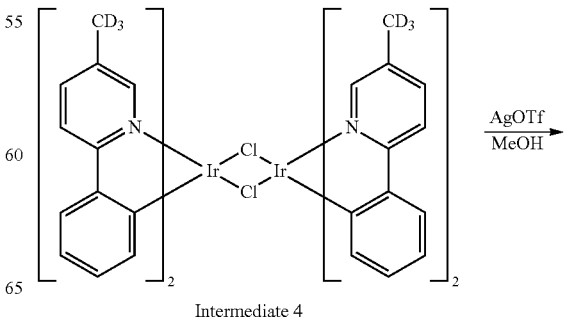

Intermediate 4

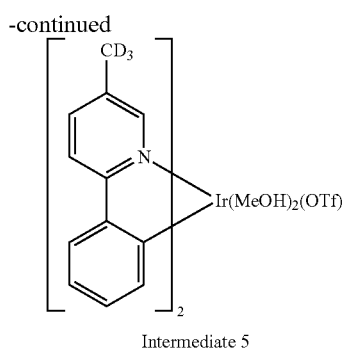

Intermediate 5

Intermediate 4 (7.2 g, 6.3 mmol), silver tri late (1.7 g, 6.0 mmol) and Methanol (15 mL) were added to a 500 mL round-bottomed flask. N$_2$ replacement three times and N$_2$ protection, stirred at room temperature overnight. After the reaction cooled, filtered with diatomite and washed twice with DCM, then concentrated to obtain Intermediate 5 (9.4 g, 100% yield), Step 3:

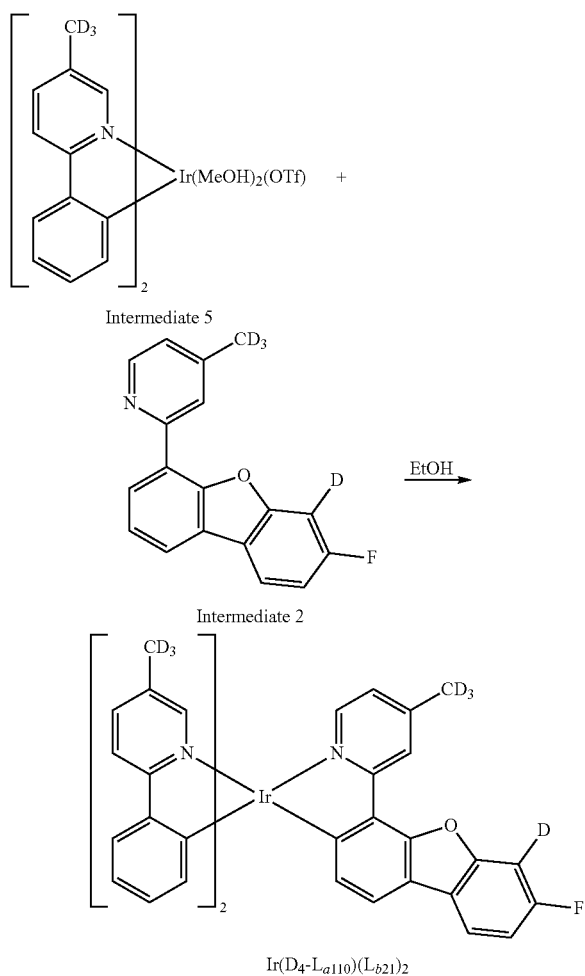

Intermediate 2 (2.4 g, 8.6 mmol), iridium complex Intermediate 5 (4.6 g, 6.1 mmol) and ethanol (250 mL) were added to a 500 mL round-bottomed flask. N$_2$ replacement three times and N$_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(D$_4$-L$_{a110}$)(L$_{b21}$)$_2$ as a yellow solid (1.2 g, 28% yield). The product was confirmed as the target product, with a molecular weight of 815.

Synthesis Example 6: Synthesis of Ir(D-L$_{a94}$)(L$_{b1}$)$_2$

Step 1:

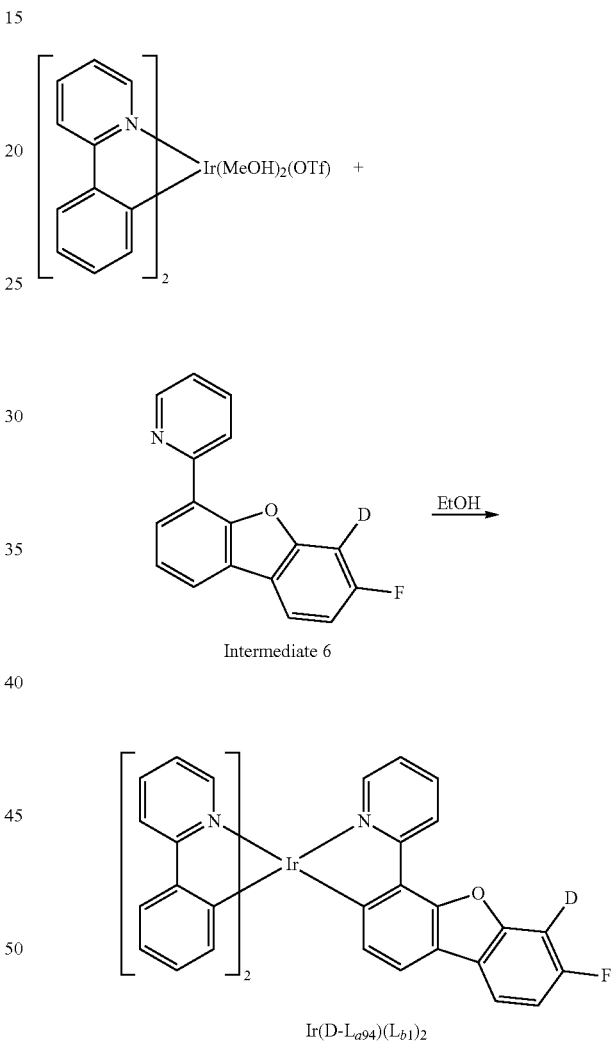

Intermediate 6 (2.5 g, 9.5 mmol), iridium complex (4.5 g, 6.3 mmol) and ethanol (250 mL) were added to a 500 mL round-bottomed flask. N$_2$ replacement three times and N$_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(D-L$_{a94}$)(L$_{b1}$)$_2$ as a yellow solid (1.2 g, 28% yield). The product was confirmed as the target product, with a molecular weight of 764.

Synthesis Example 7: Synthesis of Ir(L$_{a107}$)(L$_{b1}$)$_2$

Step 1:

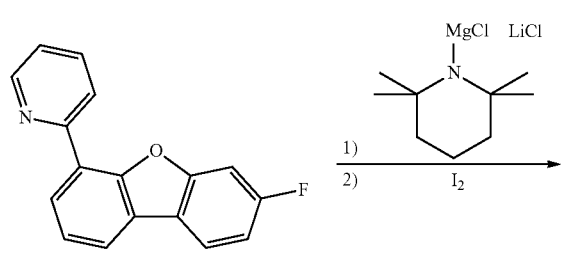

2-(7-fluorodibenzo[b,d]furan-4-yl)pyridine (11.7 g, 44.5 mmol) and 200 mL THF was added to a 1000 mL round-bottomed flask, N$_2$ replacement three times and N$_2$ protection, then put the flask into ice-bath to cool down the reaction system, 135 mL of 1.0 M 2,2,6,6-tetramethylpiperidinylmagnesium chloride lithium chloride complex in tetrahydrofuran was added dropwise and carefully, kept stirring for 2 h, then iodine (13.6 g, 53.4 mmol) was added into the flask. Raise the reaction to room temperature and stir overnight. After the reaction was finished, put the flask into ice-bath, saturated sodium thiosulfate solution and ammonium chloride solution was added n turn, then extracted with DCM and washed with brine, the combined organic layers dried with anhydrous magnesium sulfate, then concentrated, the crude product was purified by column chromatography, eluting with PE:DCM=2:1 to 1:1 (v/v) to obtain intermediate 7 as a white solid (15.1 g, 87.6% yield).

Step 2:

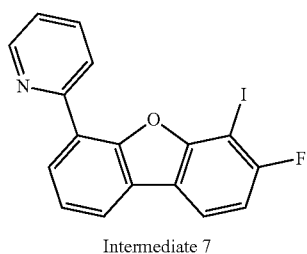

intermadiate 7

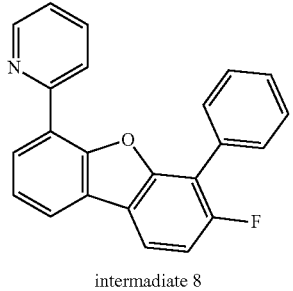

intermadiate 8

Intermediate 7 (21.7 g, 55.8 mmol), phenylboronic acid (8.5 g, 69.7 mmol), Pd(dppf)Cl$_2$ (2.0 g, 2.8 mmol), potassium carbonate (16.9 g, 122.8 mmol), dioxane (300 mL) and water (80 mL) were added to a 500 mL round-bottomed flask. N$_2$ replacement three times and N$_2$ protection, stirred at 100° C. for overnight. After the reaction cooled, extracted with DCM and washed with brine, the combined organic layers dried with anhydrous magnesium sulfate, then concentrated. the crude product was purified by column chromatography, eluting with PE:DCM=1:1 to 1:2 (v/v) to obtain intermediate 8 as a white solid (18 g, 95% yield).

Step 3:

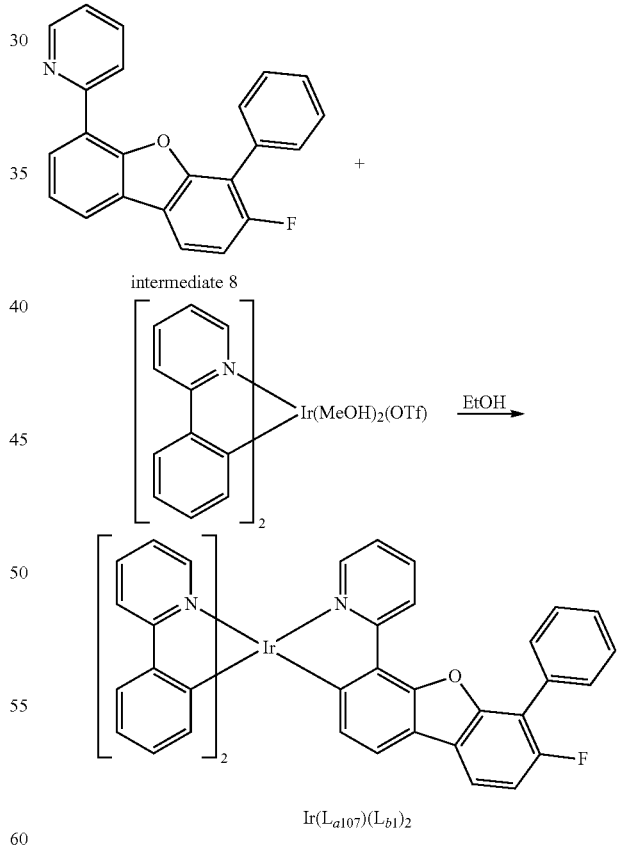

Ir(L$_{a107}$)(L$_{b1}$)$_2$

Intermediate 8 (1.9 g, 5.6 mmol), iridium complex (3.3 g, 4.7 mmol) and ethanol (250 mL) were added to a 500 mL round-bottomed flask. N$_2$ replacement three times and N$_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(La$_{107}$)(L$_{b1}$)$_2$ as a yellow solid (1.1 g, 26.3% yield). The product was confirmed as the target product, with a molecular weight of 839.

Synthesis Example 8: Synthesis of Ir(L$_{a754}$)(L$_{b1}$)$_2$

Step 1:

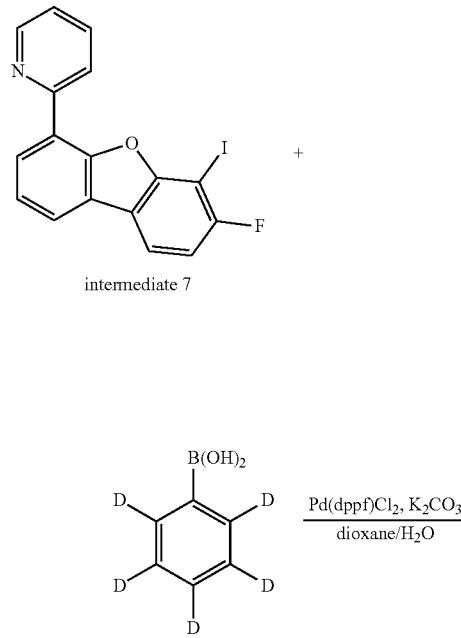

Step 2:

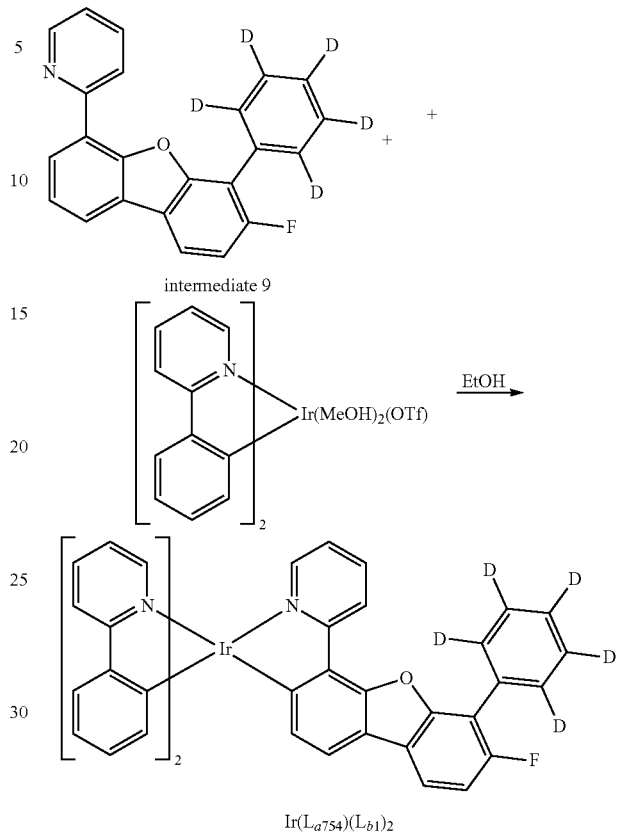

Intermediate 7 (3.8 g, 10.0 mmol), (phenyl-d$_5$)boronic acid (1.3 g, 10.0 mmol), Pd(dppf)Cl$_2$ (0.4 g, 0.5 mmol), potassium carbonate (3.5 g, 25 mmol), dioxane (200 mL) and water (60 mL) were added to a 500 mL round-bottomed flask. N$_2$ replacement three times and N$_2$ protection, stirred at 100° C. for overnight. After the reaction cooled, extracted with DCM and washed with brine, the combined organic layers dried with anhydrous magnesium sulfate, then concentrated the crude product was purified by column chromatography, eluting with PE:DCM=1:1 to 1:2 (v/v) to obtain intermediate 9 as a white solid (2.4 g, 70% yield).

Intermediate 9 (2.4 g, 7.0 mmol), iridium complex (3.3 g, 4.7 mmol) and ethanol (250 mL) were added to a 500 mL round-bottomed flask. N$_2$ replacement three times and N$_2$ protection, stirred at 100° C. for 48 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(La$_{754}$)(L$_{b1}$)$_2$ as a yellow solid (1.5 g, 38% yield). The product was confirmed as the target product, with a molecular weight of 844.

Synthesis Example 9: Synthesis of Ir(L$_{a757}$)(L$_{b1}$)$_2$

Step 1:

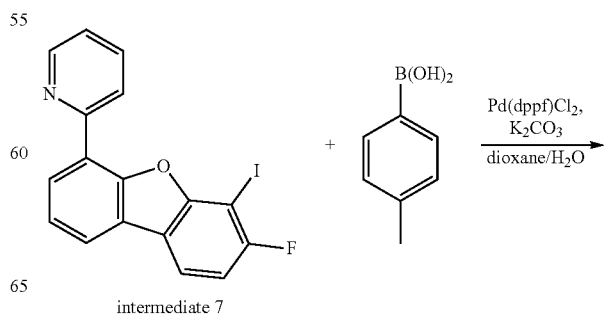

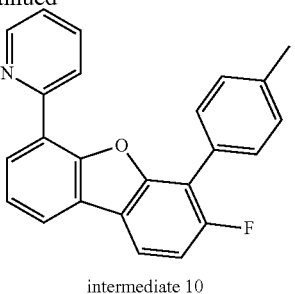

intermediate 10

Intermediate 7 (4.0 g, 10.3 mmol), p-tolylboronic acid (2.1 g, 15.4 mmol), Pd(dppf)Cl₂ (0.4 g, 0.5 mmol) potassium carbonate (4.3 g, 31.0 mmol), dioxane (200 mL) and water (60 mL) were added to a 500 mL round-bottomed flask. $N_2$ replacement three times and $N_2$ protection, stirred at 100° C. for overnight. After the reaction cooled, extracted with DCM and washed with brine, the combined organic layers dried with anhydrous magnesium sulfate, then concentrated, the crude product was purified by column chromatography, eluting with PE:DCM=1:1 to 1:2 (v/v) to obtain intermediate 10 as a white solid (3.3 g, 91% yield).

Step 2:

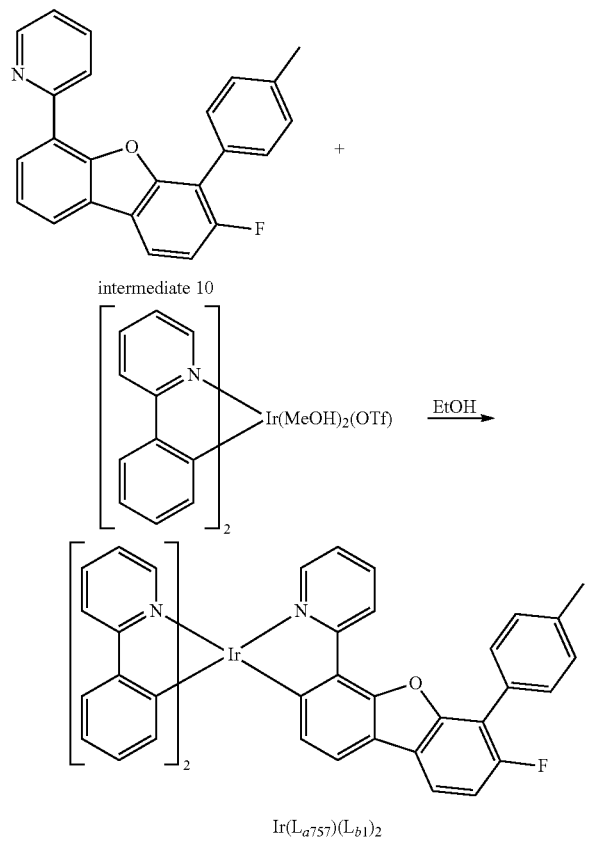

Ir(L$_{a757}$)(L$_{b1}$)₂

Intermediate 10 (2.5 g, 7.0 mmol), iridium complex (3.3 g, 4.7 mmol) and ethanol (250 mL) were added to a 500 mL round-bottomed flask. $N_2$ replacement three times and $N_2$ protection, stirred at 100° C. for 24 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(D-La$_{757}$)(L$_{b1}$)₂ as a yellow solid (1.6 g, 41% yield). The product was confirmed as the target product, with a molecular weight of 853.

Synthesis Example 10: Synthesis of Ir(L$_{a781}$)(L$_{b1}$)₂

Step 1:

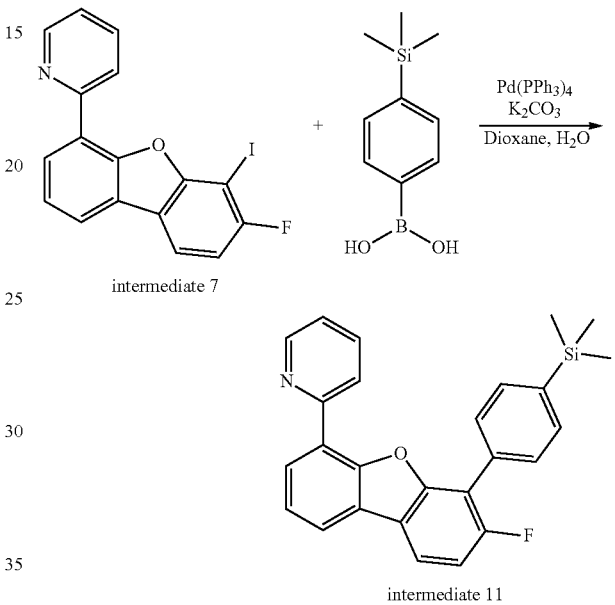

intermediate 7

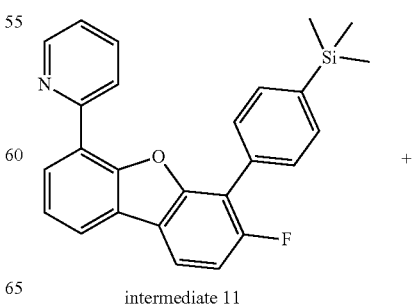

intermediate 11

Intermediate 7 (4.2 g, 10.8 mmol), (4-(trimethylsilyl)phenyl)boronic acid (2.3 g, 11.88 mmol), Pd(PPh₃)₄ (0.6 g, 0.5 mmol), potassium carbonate (2.2 g, 16.2 mmol), dioxane (200 mL) and water (60 mL) were added to a 500 mL round-bottomed flask. $N_2$ replacement three times and $N_2$ protection, stirred at 100° C. for overnight. After the reaction cooled, extracted with EA and washed with brine, the combined organic layers dried with anhydrous magnesium sulfate, then concentrated the crude product was purified by column chromatography, eluting with PE:EA=10:1 to 5:2 (v/v) to obtain intermediate 11 as a white solid (2.6 g, 59% yield).

Step 2:

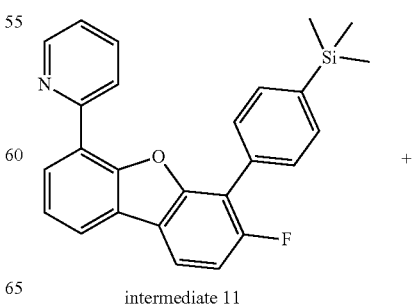

intermediate 11

-continued

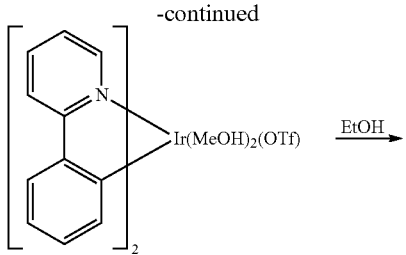

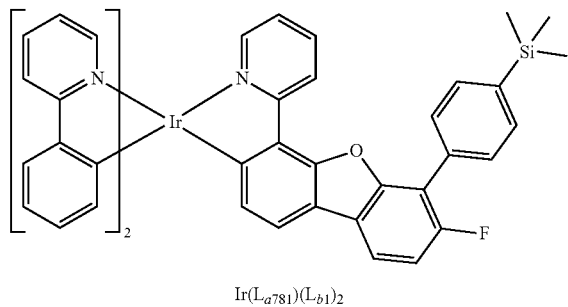

Ir(L$_{a781}$)(L$_{b1}$)$_2$

Intermediate 11 (2.6 g, 6.3 mmol), iridium complex (3.0 g, 4.2 mmol) and ethanol (100 mL) were added to a 250 mL round-bottomed flask. N$_2$ replacement three times and N$_2$ protection, stirred at 100° C. for 48 h. After the reaction cooled, filtered with diatomite, washed with methanol and n-hexane each twice, the yellow solid above the diatomite was dissolved with dichloromethane. The combined organic layers dried with anhydrous magnesium sulfate, then concentrated. The crude product was purified by column chromatography to obtain Ir(La$_{781}$)(L$_{b1}$)$_2$ as a yellow solid (1.38 g, 36% yield). The product was confirmed as the target product, with a molecular weight of 911.

The persons skilled in the art should know that the above preparation method is only an illustrative example, and the persons skilled in the art can obtain the structure of other compounds of the present invention by modifying the above preparation method.

Device Example

A glass substrate with 80 nm thick indium-tin-oxide (ITO) anode was first cleaned and then treated with oxygen plasma and UV ozone. After the treatments, the substrate was baked in a glovebox to remove moisture. The substrate was then mounted on a substrate holder and loaded into a vacuum chamber. The organic layers specified below were deposited in sequence by thermal vacuum deposition on the ITO anode at a rate of 0.2-2 Å/s at a vacuum level of around $10^{-8}$ torr. Compound HI (100 Å) was used as the hole injection layer (HIL). Compound (350 Å) was used as the hole transporting layer (HTL). Compound EB (50 Å) was used as the electron blocking layer (EBL). Then, the inventive compound or the comparative compound was doped in the host Compound EB and the Compound HB as the emitting layer (EML, 400 Å). On the EML, Compound HB (100 Å) was deposited as the hole blocking layer (HBL). Compound ET and 8-Hydroxyquinolinolato-lithium (Liq) (35:65, 350 Å) was deposited as the electron transporting layer (ETL). Finally, 10 Å of Liq was deposited as the electron injection layer (EIL) and 1200 Å of Al was deposited as the cathode. The device was then transferred back to the glovebox and encapsulated with a glass lid and a moisture getter to complete the device.

The detailed emitting layer structures and thicknesses are shown in the table below. In the layers in which more than one materials were used, they were obtained by doping different compounds in the weight ratios described therein.

TABLE 1

Device structure of device examples

| Device ID | EML |
|---|---|
| Example 1 | Compound EB:Compound HB:Compound Ir(L$_{a94}$)(L$_{b1}$)$_2$ (46:46:8) (400 Å) |
| Example 2 | Compound EB:Compound HB:Compound Ir(L$_{a110}$)(L$_{b1}$)$_2$ (46:46:8) (400 Å) |
| Example 3 | Compound EB:Compound HB:Compound Ir(D$_4$-L$_{a110}$)(L$_{b1}$)$_2$ (46:46:8) (400 Å) |
| Example 4 | Compound EB:Compound HB:Compound Ir(D$_4$-L$_{a110}$)(L$_{b21}$)$_2$ (46:46:8) (400 Å) |
| Example 5 | Compound EB:Compound HB:Compound Ir(D-L$_{a94}$)(L$_{b1}$)$_2$ (46:46:8) (400 Å) |
| Example 6 | Compound EB:Compound HB:Compound Ir(L$_{a107}$)(L$_{b1}$)$_2$ (46:46:8) (400 Å) |
| Example 7 | Compound EB:Compound HB:Compound Ir(L$_{a754}$)(L$_{b1}$)$_2$ (46:46:8) (400 Å) |
| Example 8 | Compound EB:Compound HB:Compound Ir(L$_{a757}$)(L$_{b1}$)$_2$ (46:46:8) (400 Å) |
| Example 9 | Compound EB:Compound HB:Compound Ir(L$_{a781}$)(L$_{b1}$)$_2$ (46:46:8) (400 Å) |
| Comparative Example 1 | Compound EB:Compound HB:Compound A (46:46:8) (400 Å) |
| Comparative Example 2 | Compound EB:Compound HB:Compound B (46:46:8) (400 Å) |
| Comparative Example 3 | Compound EB:Compound HB:Compound C (46:46:8) (400 Å) |
| Comparative Example 4 | Compound EB:Compound HB:Compound D (46:46:8) (400 Å) |
| Comparative Example 5 | Compound EB:Compound HB:Compound E (46:46:8) (400 Å) |
| Comparative Example 6 | Compound EB:Compound HB:Compound F (46:46:8) (400 Å) |
| Comparative Example 7 | Compound EB:Compound HB:Compound G (46:46:8) (400 Å) |
| Comparative Example 8 | Compound EB:Compound HB:Compound H (46:46:8) (400 Å) |

Structure of the materials used in the devices are shown as below:
Compound HI
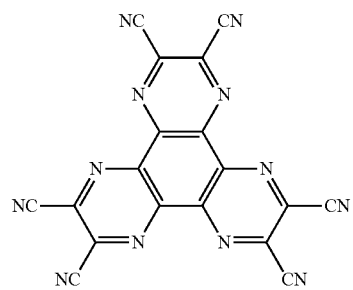
Compound HT
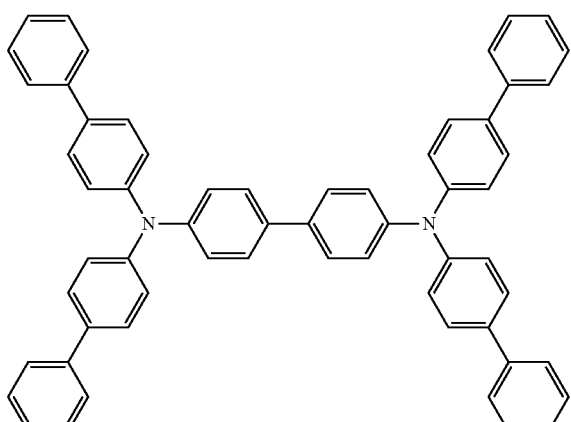
Compound EB
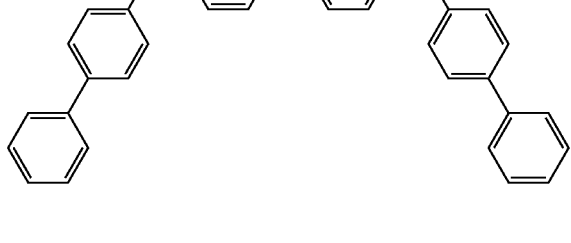
Compound HB
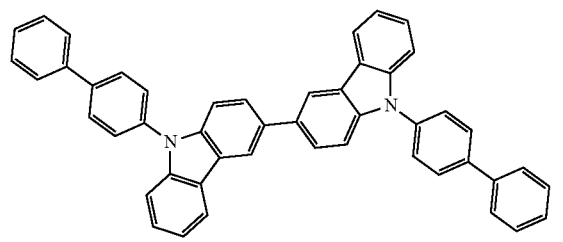
Compound ET
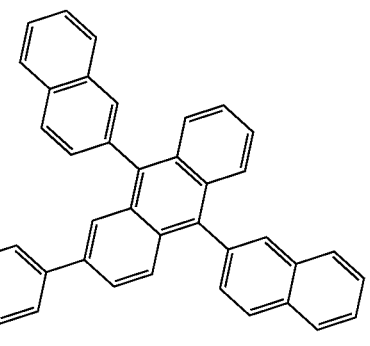
Compound A
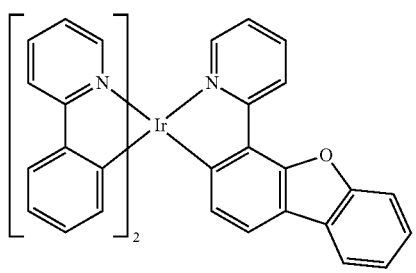
Compound B
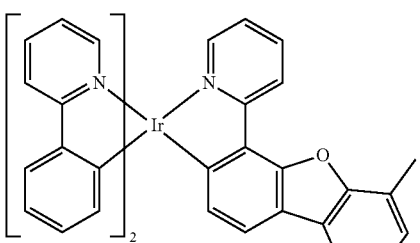
Compound C
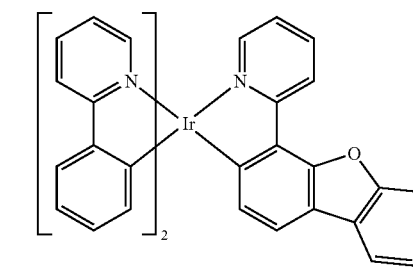
Compound D
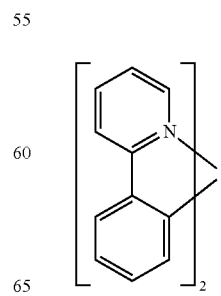

-continued

Compound E

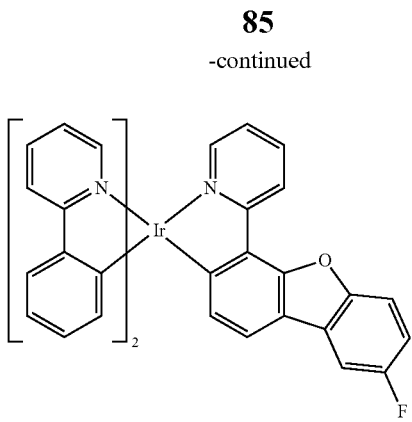

Compound F

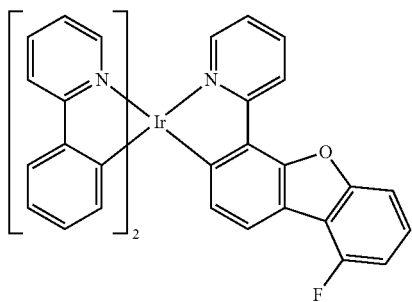

Compound G

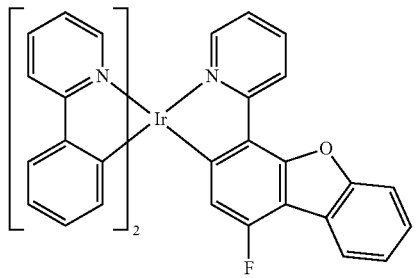

Compound H

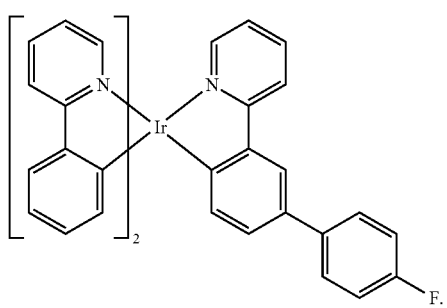

The IVL and lifetime characteristics of the devices were measured at various current densities and voltages. The luminescence efficiency (LE), external quantum efficiency (EQE), $\lambda_{max}$, full width at half maximum (FWHM), voltage (V) and CIE data were measured at 1000 nits. The lifetime was tested at a constant current from an initial brightness of 10000 nits. The sublimation temperature (Sub T) of the materials was tested.

TABLE 2 devices data

| Device ID | Sub T (° C.) | CIE (x, y) | $\lambda_{max}$ (nm) | FWHM (nm) | Voltage (V) | LE (cd/A) | EQE (%) | LT95 (h) |
|---|---|---|---|---|---|---|---|---|
| Example 1 | 253 | (0.33, 0.64) | 527 | 53 | 2.98 | 84 | 22 | 546 |
| Example 2 | 263 | (0.31, 0.64) | 522 | 59 | 2.88 | 85 | 23 | 384 |
| Example 3 | 264 | (0.32, 0.64) | 522 | 61 | 2.91 | 84 | 22 | 460 |
| Example 4 | 280 | (0.33, 0.63) | 525 | 61 | 2.71 | 88 | 23 | 427 |
| Example 5 | 247 | (0.34, 0.63) | 527 | 59 | 2.94 | 87 | 23 | 570 |
| Example 6 | 287 | (0.35, 0.60) | 528 | 62 | 2.93 | 95 | 23 | 895 |
| Example 7 | 277 | (0.34, 0.62) | 529 | 62 | 3.05 | 94 | 24 | 946 |
| Example 8 | 278 | (0.35, 0.62) | 529 | 61 | 2.92 | 94 | 24 | 830 |
| Example 9 | 276 | (0.35, 0.62) | 529 | 63 | 2.83 | 93 | 24 | 804 |
| Comparative Example 1 | 283 | (0.33, 0.64) | 527 | 53 | 2.84 | 73 | 19 | 300 |
| Comparative Example 2 | 270 | (0.35, 0.63) | 529 | 59 | 2.86 | 86 | 22 | 300 |
| Comparative Example 3 | 257 | (0.35, 0.62) | 530 | 59 | 2.92 | 91 | 23 | 280 |
| Comparative Example 4 | 266 | (0.31, 0.65) | 522 | 54 | 2.69 | 79 | 21 | 45 |
| Comparative Example 5 | 259 | (0.32, 0.65) | 524 | 51 | 2.75 | 80 | 21 | 3 |
| Comparative Example 6 | 256 | (0.31, 0.65) | 523 | 54 | 2.76 | 79 | 21 | 223 |
| Comparative Example 7 | 266 | (0.24, 0.64) | 506 | 55 | 2.71 | 63 | 19 | 34 |
| Comparative Example 8 | 257 | (0.31, 0.64) | 520 | 65 | 3.22 | 73 | 20 | 56 |

Discussion:

Table 2 shows the device properties of the inventive compounds and the comparative compounds. Compared to the parent compound (compound A), fluorine-substituted compounds Ir(L$_{a94}$)(L$_{b1}$)$_2$ did not show colour shift, which is unexpected. It has the same luminescence spectrum as comparative compound A. But its device exhibits much higher LE and EQE (22% vs. 19%). Moreover, it shows an 80% increase in lifetime compared to compound A. Its sublimation temperature is 30° C. lower than compound A (253° C. vs. 283° C.). It is desirable to have a lower sublimation temperature for better thermal stability of the metal complex. The lifetime of other Examples 2-4 are also better than Comparative Example 1, among them, the green electroluminescent of Examples 2 and 3 are more saturated. In addition, Examples 1 and 5, 2 and 3, 6 and 7 are the comparisons of hydrogen and deuterium at the corresponding substitution sites, respectively. The lifetime of Example 5 is better than Example 1, the lifetime of Example 3 is better than Example 2, the lifetime of Example 7 is better than Example 6. It proves the advantages of the deuteration in this invention.

Additionally, the metal complex used in Examples 6-9 further introduces a phenyl or substituted phenyl group on the metal complex disclosed in the present invention having a fluorine-substituted ligand at a specific position. Compared to comparative Example 1, their EQE and LE have been improved significantly, and it is more obvious that the lifetime has increased to 2.6 times and above. These Examples demonstrate the superior performance of fluorine-substituted metal complexes at specific positions in the present invention.

Methyl substituted complexes were also prepared for comparison, such as compound B and compound C. The alkyl substitution on the dibenzofuran ring exhibits a red-shifted and broadened spectral line width such that the luminescent color is not saturated. Although compared to compound A, methyl substitution reduced the sublimation temperature, ho never, it is not as significant as the compound Ir(La$_{94}$)(L$_{b1}$)$_2$ of the present invention. Methyl substitution does not improve device lifetime at all. For Comparative Example 3, using compound C as an emitter, a slight decrease in lifetime was observed, which was substituted at the same position as the compound Ir(La$_{94}$)(L$_{b1}$)$_2$ of the present invention.

Metal complexes with fluorine substituents at other positions were synthesized for comparison, compound D, E, F, G. They all have a lower sublimation temperature than compound A, but are not as low as the compound Ir(La$_{94}$)(L$_{b1}$)$_2$ of the present invention. They all show good IVL properties. But unfortunately, compared to compound A and compounds of the present invention, they all have a much shorter device lifetime. Compared Compound Ir(La$_{94}$)(L$_{b1}$)$_2$ (fluorine substituent on the dibenzofuran) with compound H (the corresponding position of fluorine substituent on the biphenyl), the device lifetime is 10 times better. It also clearly demonstrates the importance and uniqueness of fluorine substitution in this structure.

The advantages observed with the compounds of the invention are completely unexpected. Even for those skilled in the art, it is impossible to predict this situation. The present invention provides a series of stable phosphorescent material. These materials can be used in commercial OLED products.

It is understood that the various embodiments described herein are by way of example only, and are not intended to limit the scope of the invention. The present invention as claimed may therefore include variations from the particular examples and preferred embodiments described herein, as will be apparent to one of skill in the art. Many of the materials and structures described herein may be substituted with other materials and structures without deviating from the spirit of the invention. It is understood that various theories as to why the invention works are not intended to be limiting.

What is claimed is:

1. A metal complex has a general formula of M(L$_a$)$_m$(L$_b$)$_{3-m}$;
    wherein m is 1;
    wherein M is iridium;
    wherein the metal complex has a structure according to Formula 2:

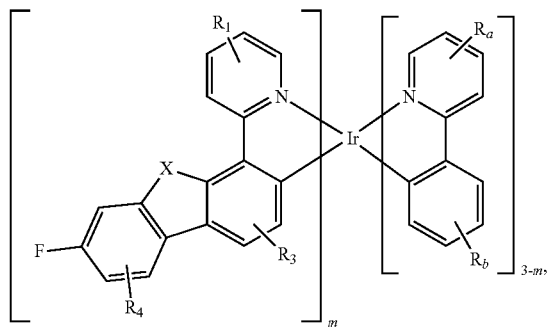

Formula 2

R$_1$, R$_a$ and R$_b$ can represent mono, di, tri, or tetra substitution, or no substitution;
R$_3$ represents mono, di, or no substitution;
R$_4$ represents mono, di or tri substitution;
wherein X is O;
wherein R$_3$ and R$_4$ are each independently selected from the group consisting of hydrogen, deuterium, a substituted or unsubstituted alkyl group having 1 to 6 carbon atoms, and a substituted or unsubstituted aryl group having 6 to 12 carbon atoms; at least one of the R$_4$ is a substituted or unsubstituted aryl group having 6 to 12 carbon atoms;
R$_1$ is selected from the group consisting of hydrogen, deuterium, a substituted or unsubstituted alkyl group having 1 to 6 carbon atoms, and a substituted or unsubstituted aryl group having 6 to 12 carbon atoms;
R$_a$ is selected from the group consisting of hydrogen, deuterium, and a substituted or unsubstituted alkyl group having 1 to 6 carbon atoms;
R$_b$ is hydrogen or deuterium;
the alkyl and aryl may be unsubstituted or may be substituted with one or more substituents selected from the group consisting of deuterium, halogen, alkyl, cycloalkyl, aryl, heteroaryl, silyl, a nitrile group, and combinations thereof.

2. The metal complex of claim 1,
    wherein R$_1$, R$_3$ and R$_b$ are each hydrogen or deuterium;
    R$_4$ is selected from the group consisting of hydrogen, deuterium, and a substituted or unsubstituted aryl group having 6 to 12 carbon atoms; at least one of the R$_4$ is a substituted or unsubstituted aryl group having 6 to 12 carbon atoms;

$R_a$ is selected from the group consisting of hydrogen, deuterium, and a substituted or unsubstituted alkyl group having 1 to 6 carbon atoms;

the alkyl and aryl may be unsubstituted or may be substituted with one or more substituents selected from the group consisting of deuterium, alkyl, silyl, and combinations thereof.

3. The metal complex of claim 1, wherein $R_4$ is selected from the group consisting of hydrogen, and a substituted or unsubstituted aryl group having 6 to 12 carbon atoms, at least one of the $R_4$ is a substituted or unsubstituted aryl group having 6 to 12 carbon atoms;

$R_1$, $R_3$ and $R_b$ are selected from hydrogen;

$R_a$ is selected from the group consisting of hydrogen, and unsubstituted alkyl group having 1 to 6 carbon atoms;

the aryl may be unsubstituted or may be substituted with one or more substituents selected from the group consisting of deuterium, alkyl, silyl, and combinations thereof.

4. The metal complex of claim 1, wherein ligand $L_a$ is selected from the group consisting of:

$L_{a107}$

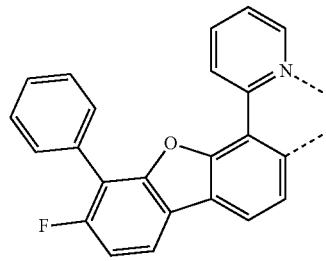

$L_{a123}$

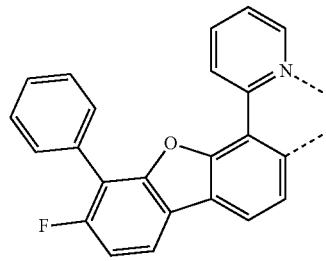

$L_{a139}$

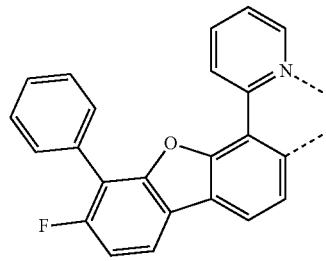

$L_{a155}$

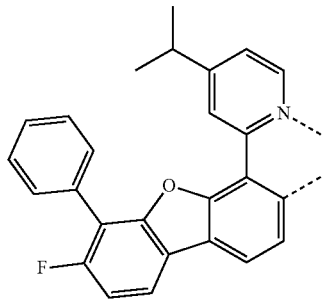

$L_{a171}$

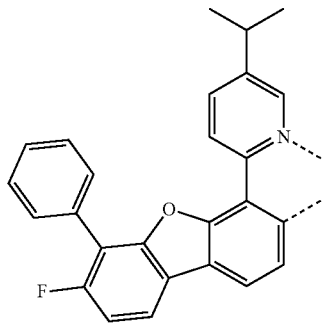

$L_{a188}$

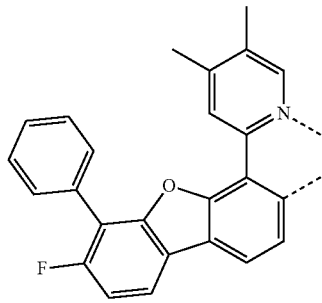

$L_{a203}$

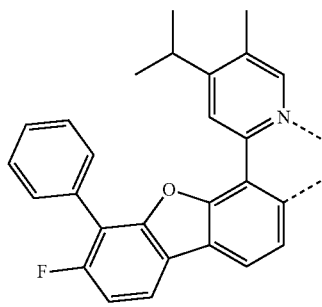

$L_{a219}$

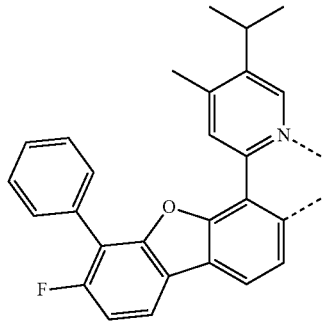

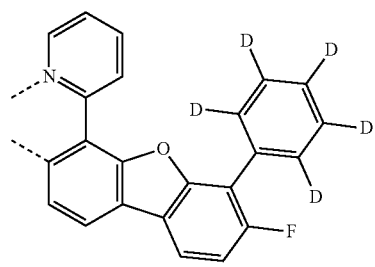
L<sub>a754</sub>
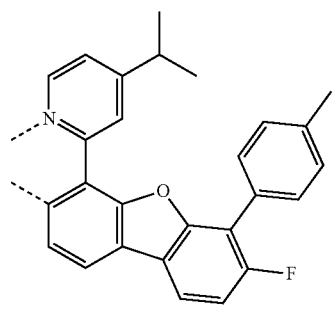
L<sub>a759</sub>
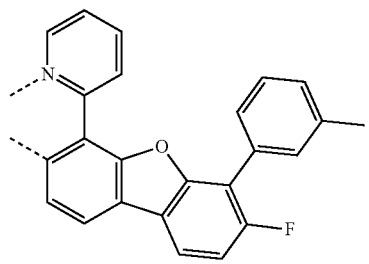
L<sub>a760</sub>
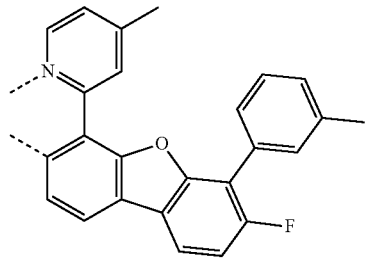
L<sub>a761</sub>
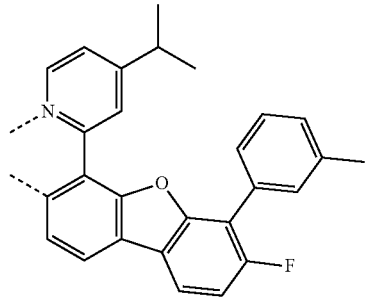
L<sub>a762</sub>
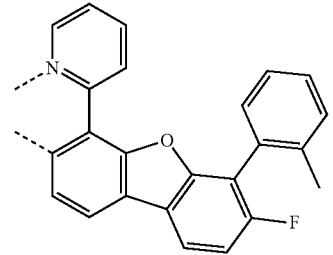
L<sub>a763</sub>

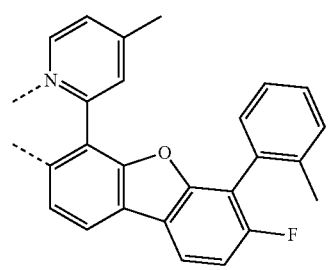 L_a764
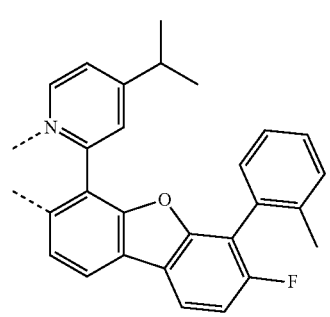 L_a765
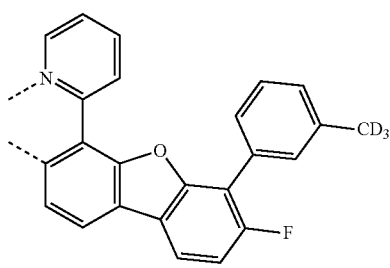 L_a766
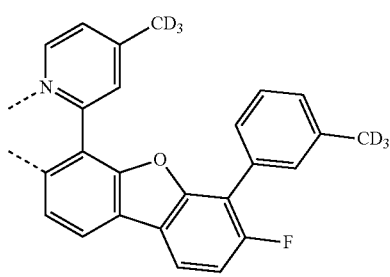 L_a767
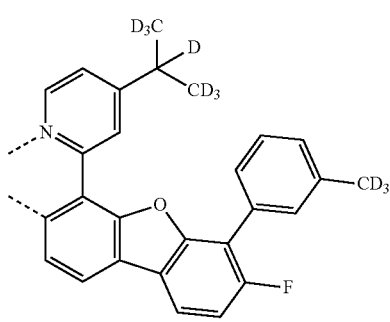 L_a768
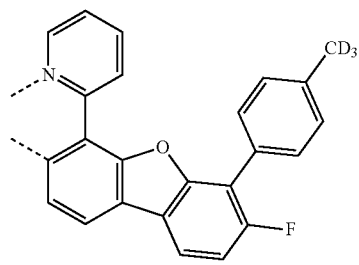 L_a769
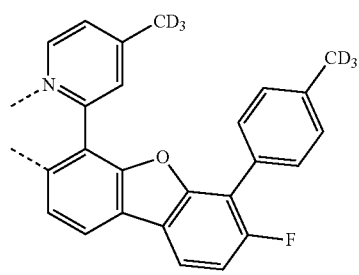 L_a770
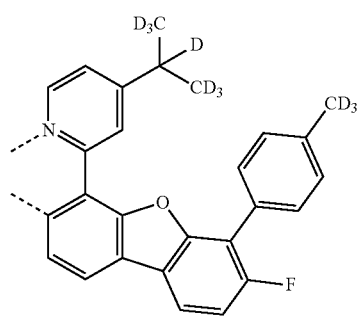 L_a771
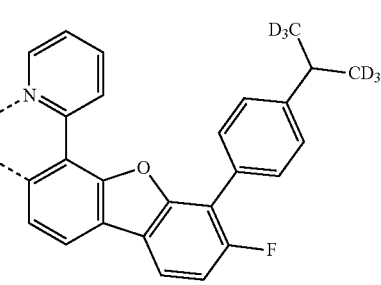 L_a772
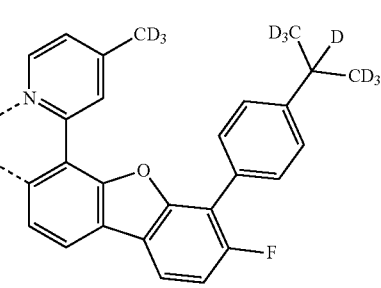 L_a773

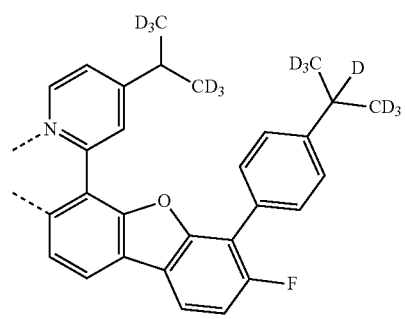
L<sub>a774</sub>
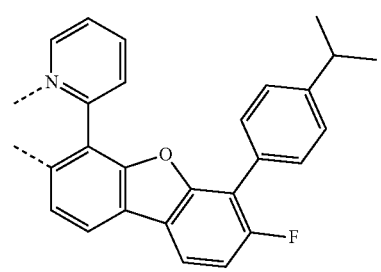
L<sub>a778</sub>
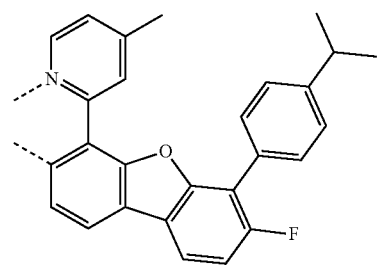
L<sub>a779</sub>
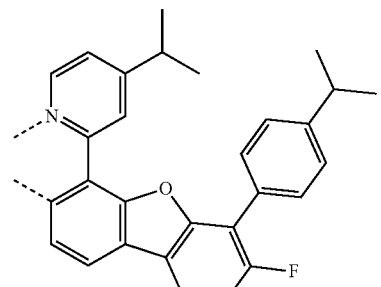
L<sub>a780</sub>
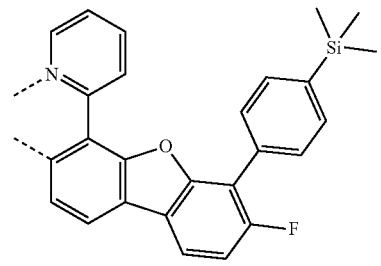
L<sub>a781</sub>
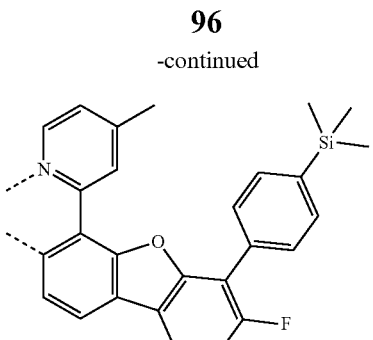
L<sub>a782</sub>
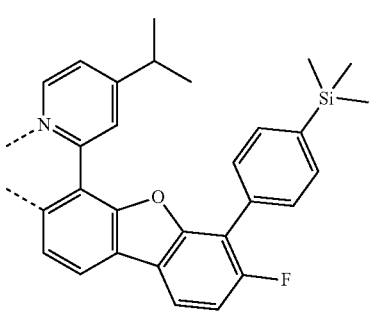
L<sub>a783</sub>
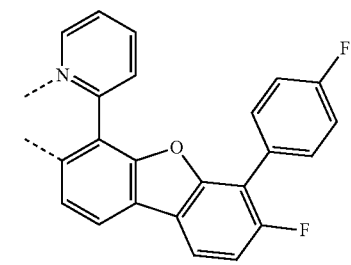
L<sub>a790</sub>
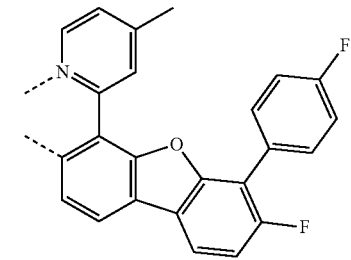
L<sub>a791</sub>
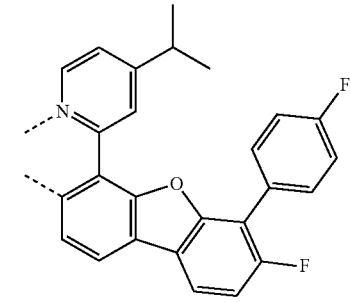
L<sub>a792</sub>

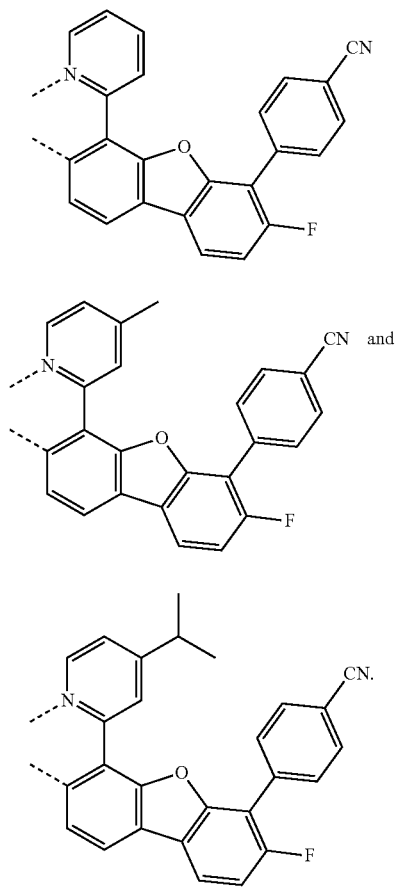
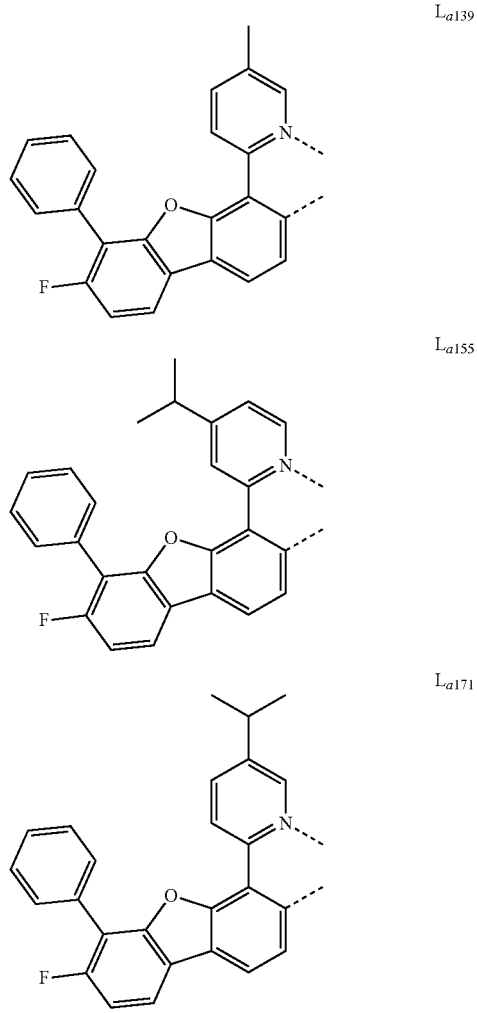
5. The metal complex of claim 4, wherein $L_a$ can be partially or fully deuterated.
6. The metal complex of claim 4, wherein the metal complex has the formula of $IrL_a(L_b)_2$, wherein $L_a$ is selected from the group consisting of
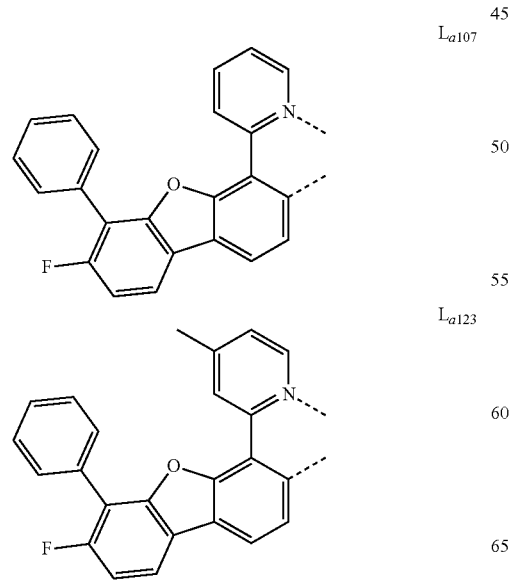
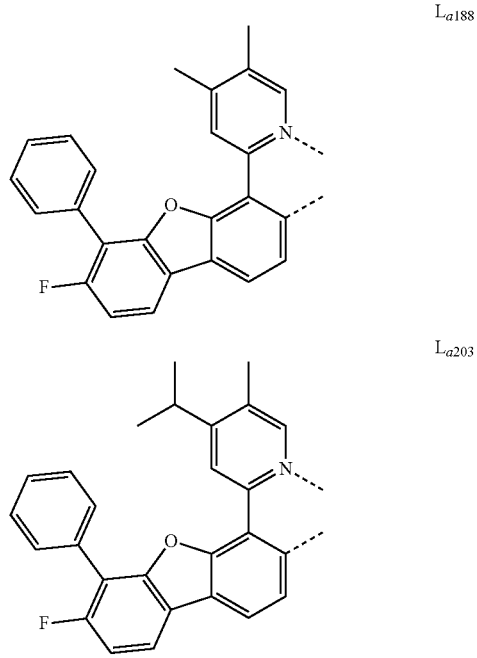

L_{a219}
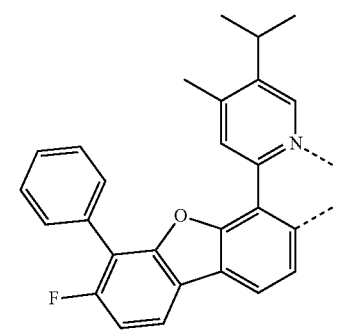
L_{a754}
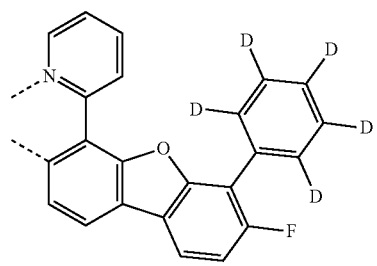
L_{a755}
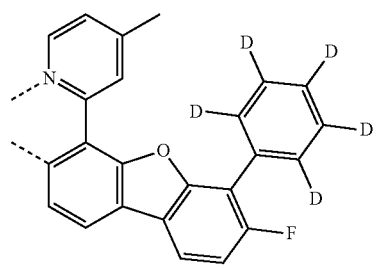
L_{a756}
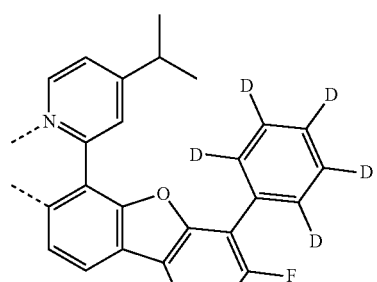
L_{a757}
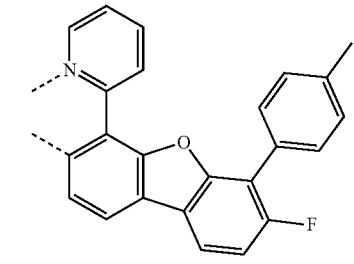
L_{a758}
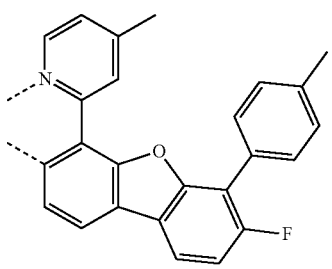
L_{a759}
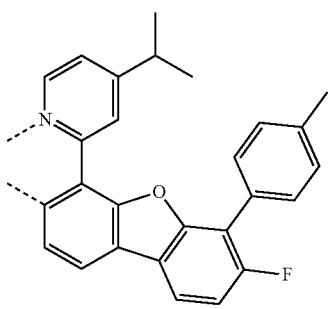
L_{a760}
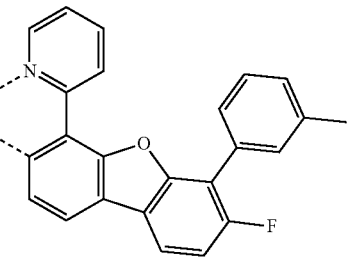
L_{a761}
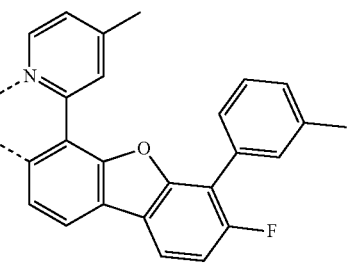
L_{a762}
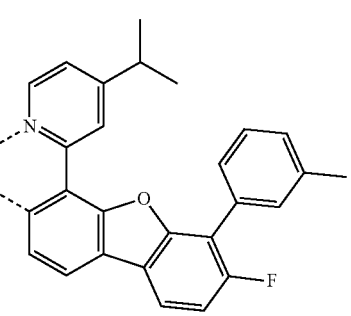

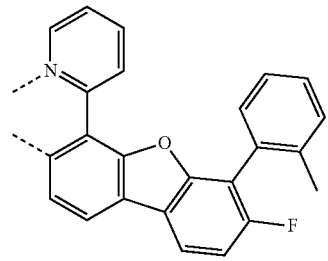
$L_{a763}$
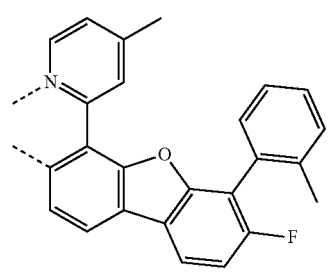
$L_{a764}$
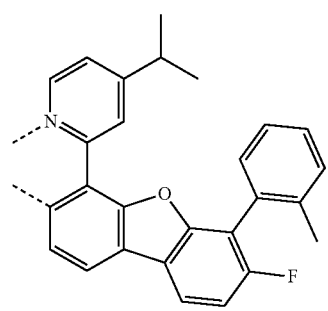
$L_{a765}$
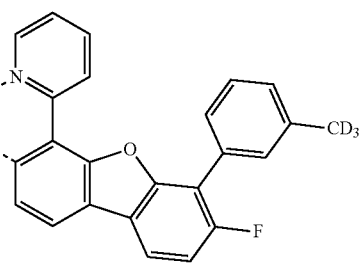
$L_{a766}$
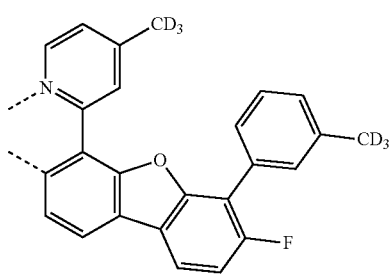
$L_{a767}$
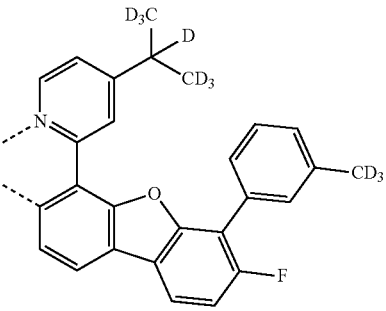
$L_{a768}$
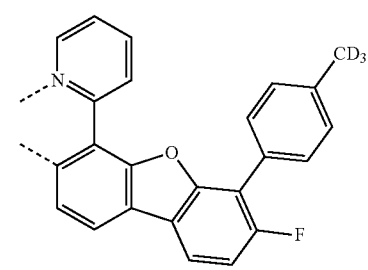
$L_{a769}$
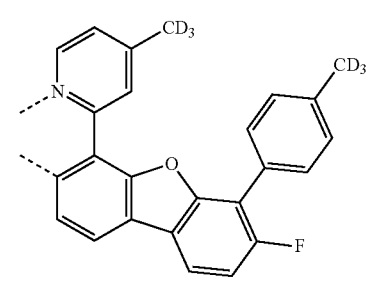
$L_{a770}$
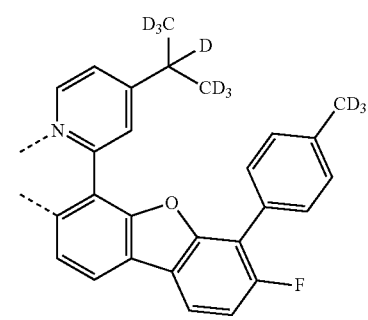
$L_{a771}$
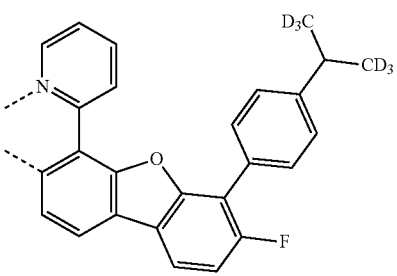
$L_{a772}$

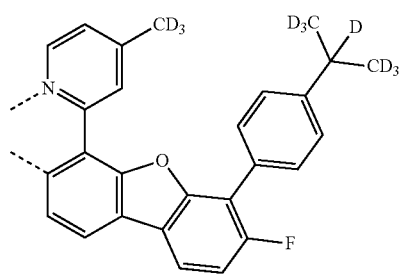 L<sub>a773</sub>
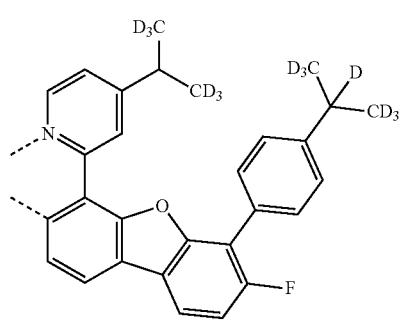 L<sub>a774</sub>
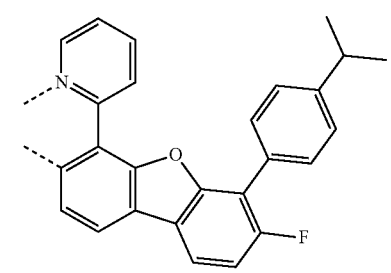 L<sub>a778</sub>
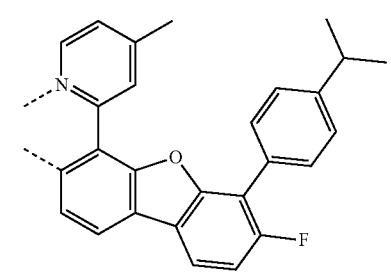 L<sub>a779</sub>
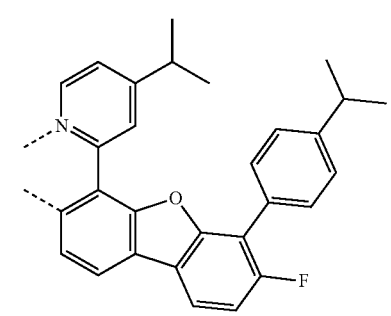 L<sub>a780</sub>
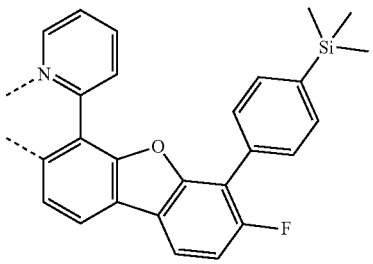 L<sub>a781</sub>
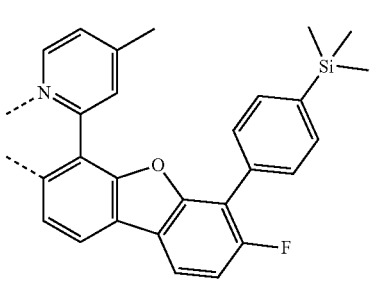 L<sub>a782</sub>
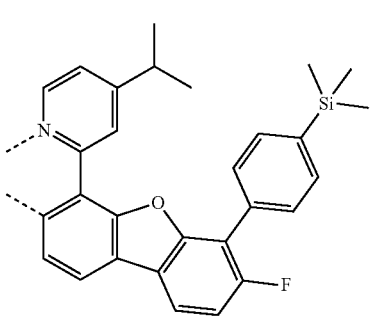 L<sub>a783</sub>
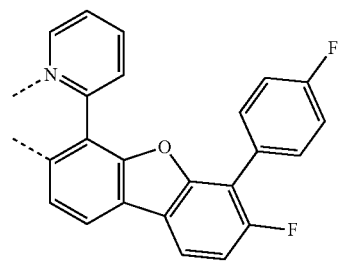 L<sub>a790</sub>
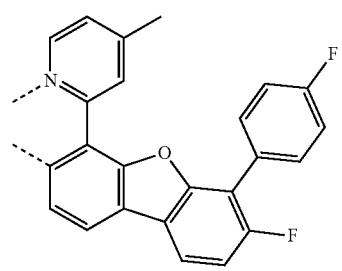 L<sub>a791</sub>

105
-continued
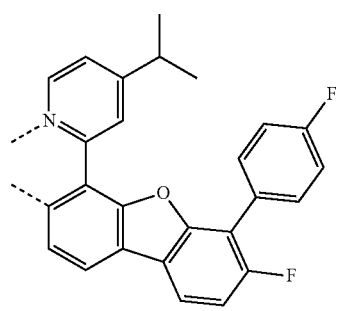
L$_{a792}$
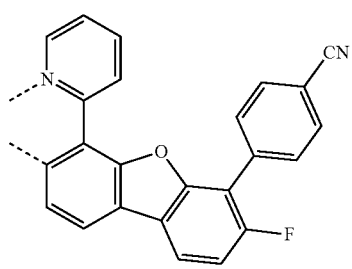
L$_{a793}$
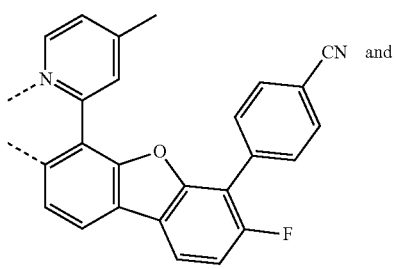
L$_{a794}$ and
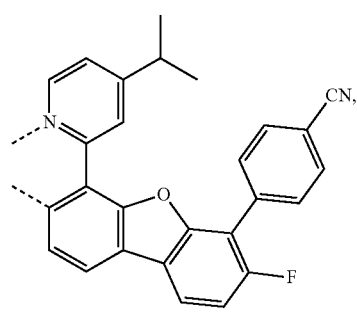
L$_{a795}$
wherein L$_b$ is selected from the group consisting of:
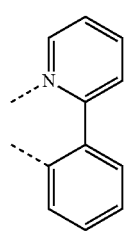
L$_{b1}$
106
-continued
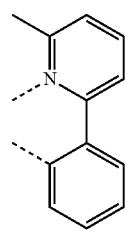
L$_{b2}$
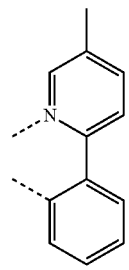
L$_{b3}$
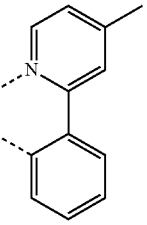
L$_{b4}$
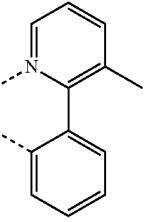
L$_{b5}$
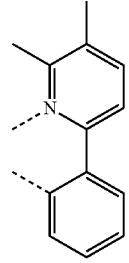
L$_{b6}$
L$_{b7}$

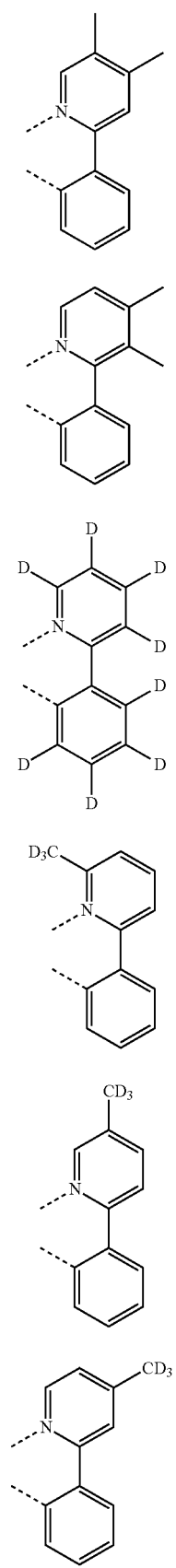
L_{b8}
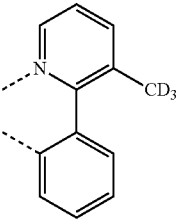
L_{b23}
L_{b9}
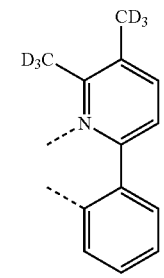
L_{b24}
L_{b19}
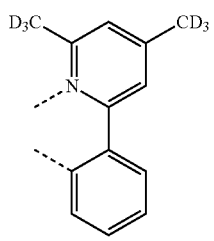
L_{b25}
L_{b20}
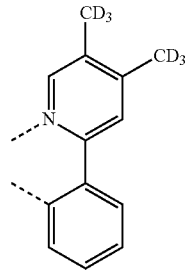
L_{b26}
L_{b21}
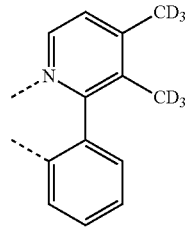
L_{b27}
L_{b22}
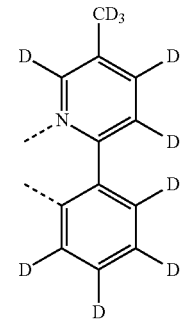
L_{b37}

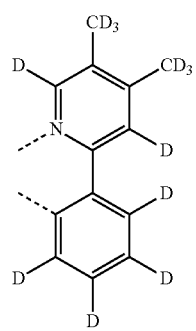 L$_{b38}$
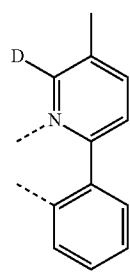 L$_{b67}$
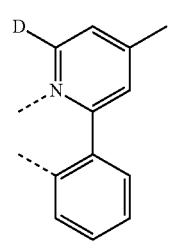 L$_{b70}$
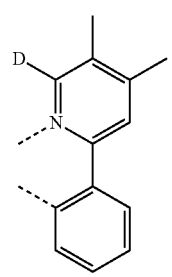 L$_{b72}$
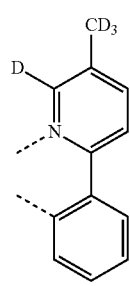 L$_{b74}$
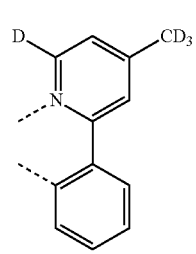 L$_{b77}$
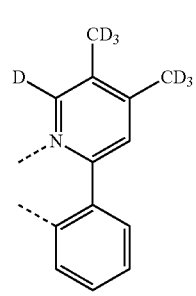 L$_{b79}$
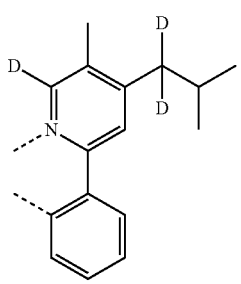 L$_{b81}$
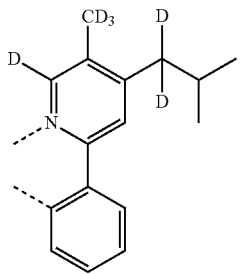 L$_{b84}$
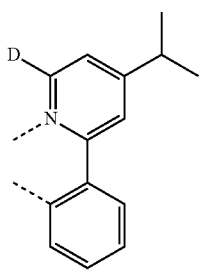 L$_{b87}$
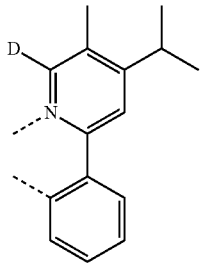 L$_{b88}$ -continued

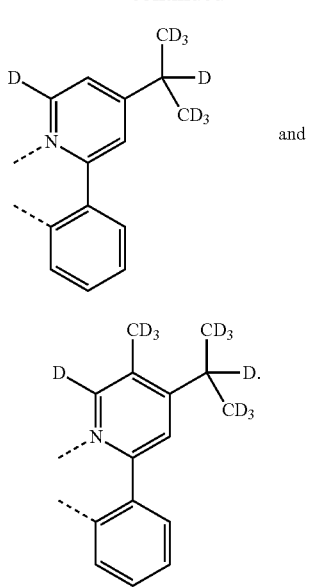

7. The metal complex of claim 1, wherein $R_4$ represents mono substitution, $R_4$ is a substituted or unsubstituted aryl group having 6 to 12 carbon atoms.

8. The metal complex of claim 1, wherein
$R_1$, $R_3$ and $R_b$ are each hydrogen;
$R_4$ is selected from the group consisting of hydrogen, and a substituted or unsubstituted phenyl; at least one of the $R_4$ is a substituted or unsubstituted phenyl;
$R_a$ is selected from the group consisting of hydrogen, and a substituted or unsubstituted methyl;
the methyl, phenyl may be unsubstituted or may be substituted with one or more substituents selected from the group consisting of deuterium, alkyl, silyl, and combinations thereof.

9. The metal complex of claim 1, wherein
$R_1$, $R_3$ and $R_b$ are each hydrogen;
$R_4$ is selected from the group consisting of hydrogen, and a substituted or unsubstituted phenyl; at least one of the $R_4$ is a substituted or unsubstituted phenyl;
$R_a$ is selected from the group consisting of hydrogen, and methyl;
the phenyl may be unsubstituted or may be substituted with one or more substituents selected from the group consisting of deuterium, methyl, silyl, and combinations thereof.

10. A formulation comprises the metal complex of claim 1.

11. An electroluminescent device comprises an anode, a cathode, and an organic layer, disposed between the anode and the cathode, wherein the organic layer comprises the metal complex of claim 1.

12. The electroluminescent device of claim 11, wherein the organic layer is an emissive layer and the metal complex is an emitter.

13. The electroluminescent device of claim 11, wherein the organic layer further comprises a host.

14. The electroluminescent device of claim 13, wherein the host material comprises at least one the chemical group selected from the group consisting of: benzene, biphenyl, pyridine, pyrimidine, triazine, carbazole, azacarbazole, indolocarbazole, dibenzothiophene, azadibenzothiophene, dibenzofuran, azadibenzofuran, dibenzoselenophene, azadibenzoselenophene, triphenylene, azatriphenylene, fluorene, silicon fluorene, naphthalene, quinoline, isoquinoline, quinazoline, quinoxaline, phenanthrene, azaphenanthrene, and combinations thereof.

15. The electroluminescent device of claim 11, wherein the electroluminescent device is incorporated into another device selected from the group consisting of a consumer product, an electronic component module, an organic light emitting device, and a lighting panel.

16. The electroluminescent device of claim 11, wherein the organic layer comprises at least two hosts.

* * * * *